United States Patent
Lu

(10) Patent No.: US 11,856,856 B2
(45) Date of Patent: Dec. 26, 2023

(54) THERMAL CONDUCTION UNIT, ELECTRONIC MODULE AND HEAT DISSIPATING DEVICE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 205 days.

(21) Appl. No.: 16/588,666

(22) Filed: Sep. 30, 2019

(65) Prior Publication Data

US 2021/0098677 A1 Apr. 1, 2021

(51) Int. Cl.
| | |
|---|---|
| *H10N 10/13* | (2023.01) |
| *H01L 23/38* | (2006.01) |
| *H10N 10/17* | (2023.01) |
| *G01N 25/32* | (2006.01) |
| *H10N 10/01* | (2023.01) |
| *H10N 10/852* | (2023.01) |
| *H10N 19/00* | (2023.01) |

(52) U.S. Cl.
CPC ............. *H10N 10/13* (2023.02); *H01L 23/38* (2013.01); *H10N 10/17* (2023.02); *G01N 25/32* (2013.01); *H10N 10/01* (2023.02); *H10N 10/852* (2023.02); *H10N 19/101* (2023.02)

(58) Field of Classification Search
CPC ......... H01L 35/30; H01L 35/32; H01L 23/38; H01L 35/16; H01L 35/325; H01L 35/34; H01L 23/49816; H01L 23/49822; H01L 23/49827; H01L 23/49833; G01N 25/32; H10N 10/13; H10N 10/17; H10N 10/01; H10N 10/852; H10N 19/101; H10N 19/00; H05K 7/20481
See application file for complete search history.

(56) References Cited

U.S. PATENT DOCUMENTS

| | | | | |
|---|---|---|---|---|
| 5,956,569 | A * | 9/1999 | Shiu .................. | H01L 23/38 136/203 |
| 2009/0301541 | A1* | 12/2009 | Watts ................ | H01L 35/00 136/205 |
| 2013/0068273 | A1* | 3/2013 | Kanno ............... | H01L 35/32 136/224 |
| 2015/0280098 | A1* | 10/2015 | Sakai ................ | H01L 35/32 136/201 |

* cited by examiner

*Primary Examiner* — Michael Y Sun
(74) *Attorney, Agent, or Firm* — FOLEY & LARDNER LLP

(57) ABSTRACT

A thermal conduction unit includes a conductive via, a periphery conductor and an isolation material. The conductive via includes a first thermoelectric material. The periphery conductor encloses the conductive via and includes a second thermoelectric material. An end of the periphery conductor is electrically connected to an end of the conductive via. The isolation material is interposed between the conductive via and the periphery conductor.

14 Claims, 47 Drawing Sheets

THERMAL CONDUCTION UNIT, ELECTRONIC MODULE AND HEAT DISSIPATING DEVICE

BACKGROUND

1. Field of the Disclosure

The present disclosure relates to a thermal conduction unit, an electronic module and a heat dissipating device, and to a thermal conduction unit including a periphery conductor enclosing a conductive via, an electronic module including the same, and a heat dissipating device including the same.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, a thermal conduction unit includes a conductive via, a periphery conductor and an isolation material. The conductive via includes a first thermoelectric material. The periphery conductor encloses the conductive via and includes a second thermoelectric material. An end of the periphery conductor is electrically connected to an end of the conductive via. The isolation material is interposed between the conductive via and the periphery conductor.

In some embodiments, an electronic module includes a first thermal conduction unit and a second thermal conduction unit. The first thermal conduction unit includes a first conductive via, a first periphery conductor and a first isolation material. The first conductive via includes a first thermoelectric material. The first periphery conductor encloses the first conductive via and includes a second thermoelectric material. An end of the first periphery conductor is electrically connected to an end of the first conductive via. The first isolation material is interposed between the first conductive via and the first periphery conductor. The second thermal conduction unit includes a second conductive via, a second periphery conductor and a second isolation material. The second conductive via includes a third thermoelectric material. The second periphery conductor encloses the second conductive via and includes a fourth thermoelectric material. An end of the second periphery conductor is electrically connected to an end of the second conductive via. The second periphery conductor of the second thermal conduction unit is connected to the first periphery conductor of the first thermal conduction unit. The second isolation material is interposed between the second conductive via and the second periphery conductor.

In some embodiments, a heat dissipating device includes a thermal-to-electrical energy conversion apparatus and an electrical-to-thermal energy conversion apparatus. The thermal-to-electrical energy conversion apparatus includes a plurality of upper thermal conduction units electrically connected to one another. Each of the upper thermal conduction units includes an upper conductive via, an upper periphery conductor and an upper isolation material. The upper conductive via includes a thermoelectric material. The upper periphery conductor encloses the upper conductive via and includes a thermoelectric material. An end of the upper periphery conductor is electrically connected to an end of the upper conductive via. The upper isolation material is interposed between the upper conductive via and the upper periphery conductor. The electrical-to-thermal energy conversion apparatus is thermally connected to the thermal-to-electrical energy conversion apparatus, and includes a plurality of lower thermal conduction units electrically connected to one another. Each of the lower thermal conduction units includes a lower conductive via, a lower periphery conductor and a lower isolation material. The lower conductive via includes a thermoelectric material. The lower periphery conductor encloses the lower conductive via and includes a thermoelectric material. An end of the lower periphery conductor is electrically connected to an end of the lower conductive via. The lower isolation material is interposed between the lower conductive via and the lower periphery conductor.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
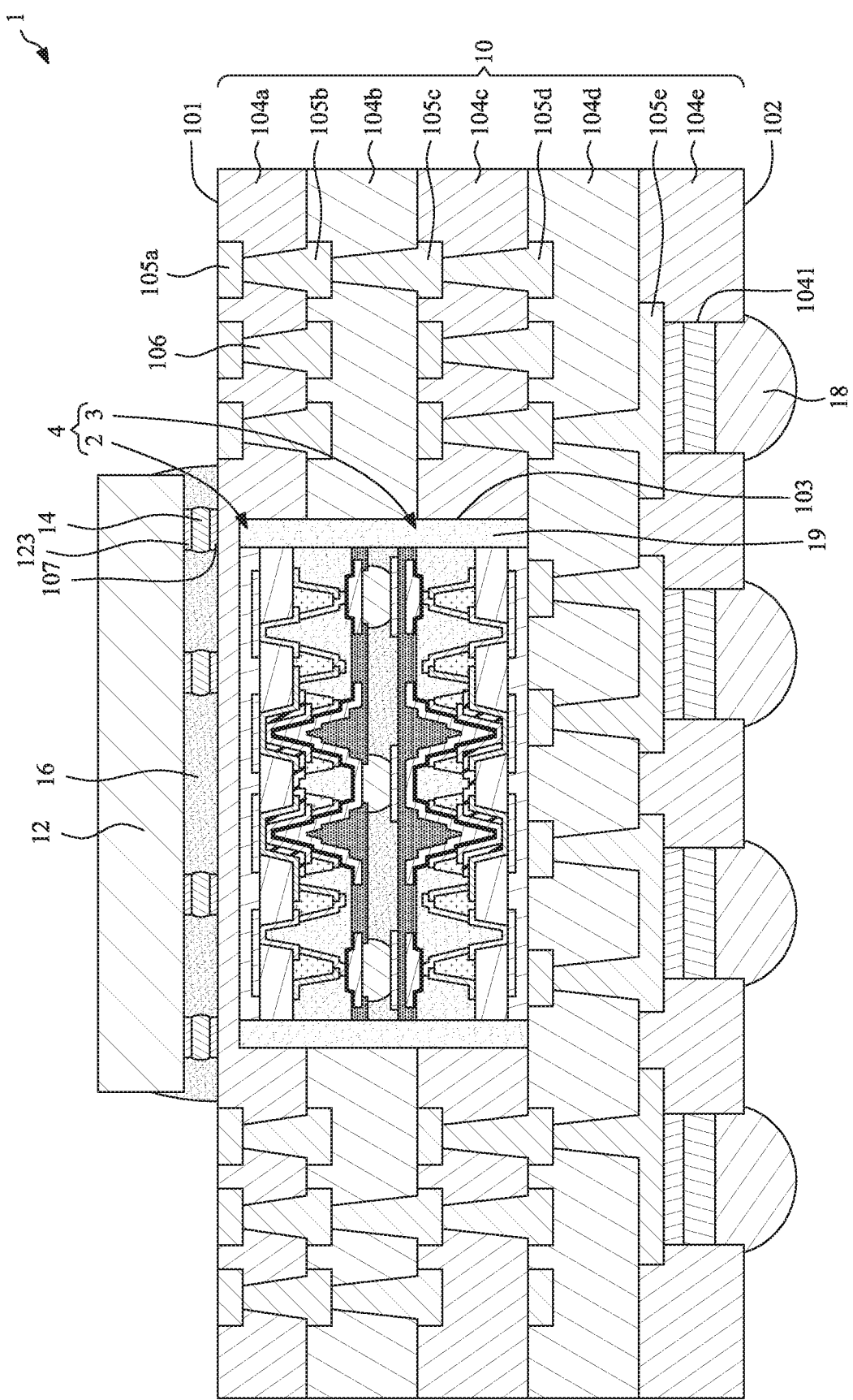
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a number of substrate vias or a thickness of metal layer are increased. However, the improvement of heat dissipation efficiency is slight. In some comparative embodiments, a thermal interface material (TIM) is used to be interposed between the devices and the package substrate. However, the temperature of the device at the center of the semiconductor package structure may not be hugely reduced. Such non-uniform temperature distribution may result in crack between the solder balls and the bonding pads of the package substrate, and delamination between the dielectric layers and the circuit layers of the package substrate. Therefore, the working life and reliability of the semiconductor package structure may be poor.

To address at least the above concerns in some embodiments, the present disclosure describes an improved electronic module including a plurality of thermal conduction units. Each of the thermal conduction units includes a periphery conductor enclosing a conductive via. Thus, highly efficient heat dissipation can be achieved. Additionally, the size of the electronic module can be reduced efficiently.

FIG. 1 illustrates a cross-sectional view of a semiconductor package structure 1 according to some embodiments of the present disclosure. The semiconductor package structure 1 includes a substrate 10, a heat dissipating device 4, a semiconductor chip 12, a plurality of internal connectors 14, an underfill 16 and a plurality of external connectors 18.

The substrate 10 has a top surface 101 and a bottom surface 102 opposite to the top surface 101, and includes a plurality of dielectric layers (including, for example, a first dielectric layer 104a, a second dielectric layer 104b, a third dielectric layer 104c, a fourth dielectric layer 104d and a fifth dielectric layer 104e) and a plurality of circuit layers (including, for example, a first circuit layer 105a, a second circuit layer 105b, a third circuit layer 105c, a fourth circuit layer 105d and a fifth circuit layer 105e formed of a metal, a metal alloy, or other conductive material) in contact with the dielectric layers 104a, 104b, 104c, 104d, 104e. The circuit layers 105a, 105b, 105c, 105d, 105e are electrically connected with one another by a plurality of inner vias 106 disposed therebetween. Each of the inner vias 106 tapers upward along a direction from the bottom surface 102 towards the top surface 101 of the substrate 10.

The substrate 10 defines a cavity 103. In some embodiments, the cavity 103 is defined by the stacked first dielectric layer 104a, the second dielectric layer 104b and the third dielectric layer 104c. The heat dissipating device 4 is accommodated in the cavity 103. The fourth dielectric layer 104d covers the third dielectric layer 104c, the cavity 103 and the heat dissipating device 4. Thus, the heat dissipating device 4 is embedded in the substrate 10. As shown in FIG. 1, an intermediate material 19 (e.g., an adhesive material) may be included to fill the gap between the heat dissipating device 4 and the sidewall of the cavity 103, so as to fix the position of the heat dissipating device 4 and prevent the heat dissipating device 4 from shifting. Further, in one embodiment, the cavity 103 may not extend through the first dielectric layer 104a. However, in other embodiment, the cavity 103 may extend through the first dielectric layer 104a, and may be recessed from the top surface 101 of the substrate 10. In addition, the top surface of the heat dissipating device 4 may be lower than the top surface 101 of the substrate 10. Alternatively, the top surface of the heat dissipating device 4 may be substantially coplanar with the top surface 101 of the substrate 10. As shown in FIG. 1, the fifth dielectric layer 104e (e.g., a solder resist layer) covers the fourth dielectric layer 104d, and defines a plurality of openings 1041 to expose portions of the fifth circuit layer 105e.

The semiconductor chip 12 is electrically connected to the first circuit layer 105a adjacent to the top surface 101 of the substrate 10 through the internal connectors 14 (e.g., solder balls). In some embodiments, the internal connectors 14 connect the bonding pads 107 of the substrate 10 and the bumps 123 of the semiconductor chip 12. The bonding pads 107 may be portions of the first circuit layer 105a, or may be electrically connected to the first circuit layer 105a. The underfill 16 is disposed between the semiconductor chip 12 and the top surface 101 of the substrate 10 to cover and protect the internal connectors 14. The external connectors 18 (e.g., solder balls) are disposed in the openings 1041 of the fifth dielectric layer 104e to electrically connect the fifth circuit layer 105e. The external connectors 18 are used for external connection.

Figure 2:
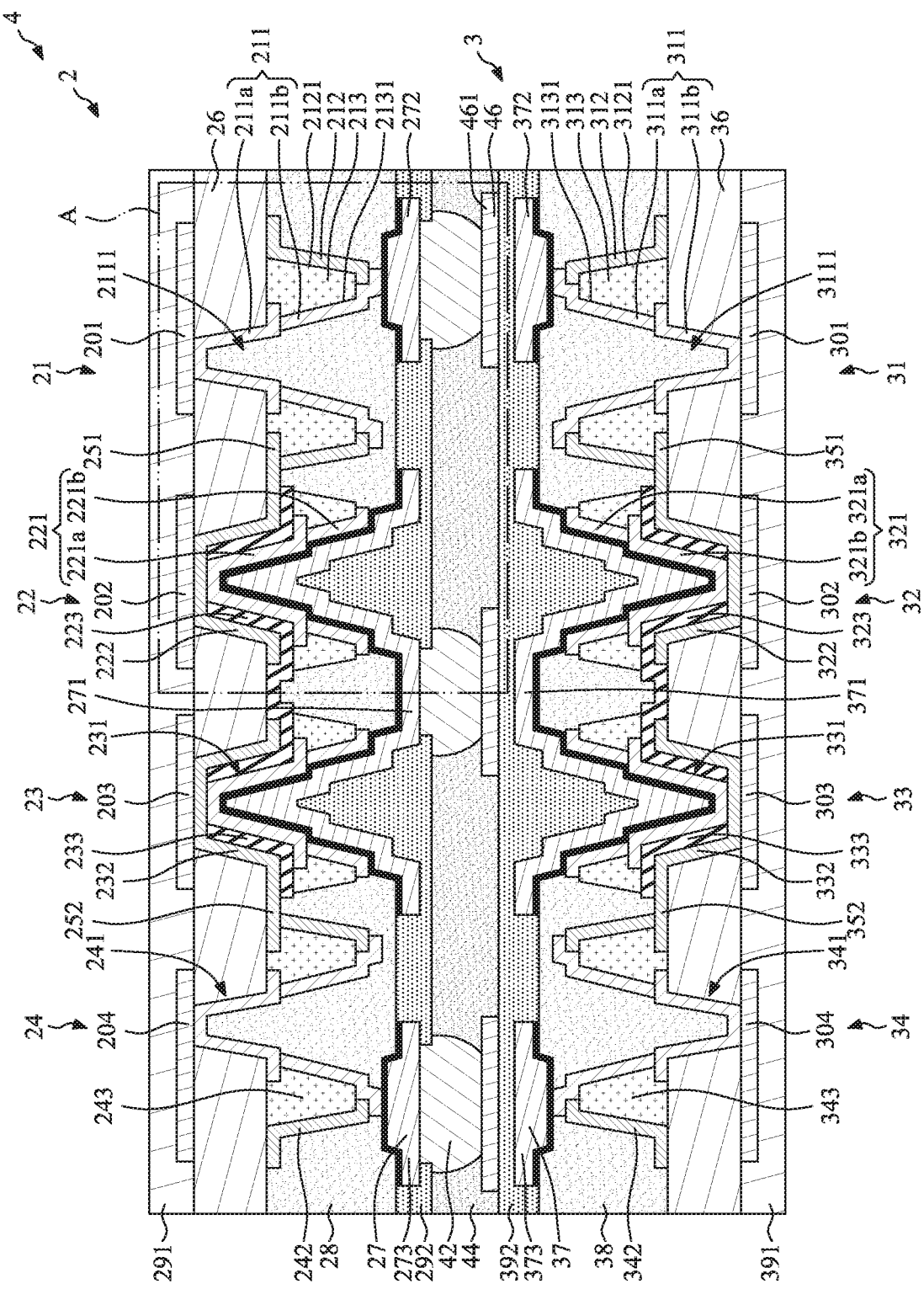
FIG. 2 illustrates a cross-sectional view of a heat dissipating device of the semiconductor package structure of FIG. 1.

FIG. 2 illustrates a cross-sectional view of the heat dissipating device 4 of the semiconductor package structure 1 of FIG. 1. The heat dissipating device 4 includes a thermal-to-electrical energy conversion apparatus 2 (e.g., a thermal transfer to electric generator (TEG)), an electrical-to-thermal energy conversion apparatus 3 (e.g., an electric transfer to thermal generator (ETG)) thermally connected to the thermal-to-electrical energy conversion apparatus 2, a plurality of interconnection elements 42, a middle circuit layer 46 and an intermediate layer 44.

The thermal-to-electrical energy conversion apparatus 2 is used for converting thermal energy into electrical energy, and includes a plurality of upper thermal conduction units (including, for example, a first upper thermal conduction unit 21, a second upper thermal conduction unit 22, a third upper thermal conduction unit 23 and a fourth upper thermal conduction unit 24) electrically connected to one another in series, a first dielectric layer 26, a second dielectric layer 28 on the first dielectric layer 26, a plurality of dummy pads 201, 202, 203, 204, a first protection layer 291, an upper patterned circuit layer 27 and a second protection layer 292.

The first upper thermal conduction unit 21 includes a first upper conductive via 211, a first upper periphery conductor 212 and a first upper isolation material 213. As shown in FIG. 2, the first upper conductive via 211 may include an upper portion 211a and a lower portion 211b with a boundary therebetween, and may taper upward. The upper portion 211a extends through the first dielectric layer 26. In some embodiments, the first upper conductive via 211 may include a first thermoelectric material, and a value of "Z×T" of the first thermoelectric material is greater than or equal to about 0.5, about 0.8, or about 1.0, wherein "Z" is a thermoelectric figure of merit, and "T" is temperature (in K).

Further, the first upper periphery conductor 212 encloses or surrounds the first upper conductive via 211, and an end of the first upper periphery conductor 212 is electrically connected to or contacts an end of the first upper conductive via 211. As shown in FIG. 2, the first upper periphery conductor 212 surrounds or encloses the lower portion 211$b$ of the first upper conductive via 211. That is, a height of the first upper periphery conductor 212 is less than a height of the first upper conductive via 211. Further, the first upper periphery conductor 212 may taper downward, that is, a taper direction of the first upper periphery conductor 212 may be different from a taper direction of the first upper conductive via 211. In some embodiments, the first upper periphery conductor 212 may include a second thermoelectric material, and a value of "Z×T" of the second thermoelectric material is greater than or equal to about 0.5, about 0.8, or about 1.0.

The first thermoelectric material and the second thermoelectric material may include at least one of ZnSb, PbTe, GeTe, SiGe, AgSbTe$_2$, SiGe, MnSi$_2$, CeSNa$_x$Co$_2$O$_4$, ZrNiSn, Bi$_2$Sr$_2$Co$_2$O$_y$, Ca$_2$Co$_2$O$_5$, Ca$_3$Co$_4$O$_9$, Bi$_2$Sb$_{2-z}$Te$_3$, a MgAgSb based material, or CsBi$_4$Te$_4$, wherein x is from 0 to 4, y is from 0 to 11, and z is from 0 to 2. However, the first thermoelectric material and the second thermoelectric material are different types of semiconductor materials. For example, the first thermoelectric material may be a p-type semiconductor material (e.g., the first upper conductive via 211 is p-type), and the second thermoelectric material may be an n-type semiconductor material (e.g., the first upper periphery conductor 212 is n-type). Alternatively, the first thermoelectric material may be an n-type semiconductor material (e.g., the first upper conductive via 211 is n-type), and the second thermoelectric material may be a p-type semiconductor material (e.g., the first upper periphery conductor 212 is p-type).

The first upper isolation material 213 is interposed between the first upper conductive via 211 and the first upper periphery conductor 212. As shown in FIG. 2, the first upper periphery conductor 212 defines a hole 2121, and the first upper isolation material 213 is disposed in the hole 2121 defined by the first upper periphery conductor 212. The first upper isolation material 213 defines a hole 2131, and the first upper conductive via 211 is disposed in the hole 2131 defined by the first upper isolation material 213. The first upper conductive via 211 may define a central hole 2111. That is, the first upper conductive via 211 may be a hollow structure. In addition, the lower portion 211$b$ of the first upper conductive via 211, the first upper periphery conductor 212 and the first upper isolation material 213 are disposed in the second dielectric layer 28. A portion of the second dielectric layer 28 extends into the central hole 2111 of the first upper conductive via 211.

The second upper thermal conduction unit 22 includes a second upper conductive via 221, a second upper periphery conductor 222 and a second upper isolation material 223. As shown in FIG. 2, the second upper conductive via 221 may include an upper portion 221$a$ and a lower portion 221$b$ with a boundary therebetween, and may taper upward. Thus, a taper direction of the first upper conductive via 211 is the same as a taper direction of the second upper conductive via 221. In some embodiments, the second upper conductive via 221 may include a third thermoelectric material, and a value of "Z×T" of the third thermoelectric material is greater than or equal to about 0.5, about 0.8, or about 1.0.

Further, the second upper periphery conductor 222 encloses or surrounds the second upper conductive via 221, and an end of the second upper periphery conductor 222 is electrically connected to or contacts an end of the second upper conductive via 221. As shown in FIG. 2, the second upper periphery conductor 222 surrounds or encloses the upper portion 221$a$ of the second upper conductive via 221. That is, a height of the second upper periphery conductor 222 is less than a height of the second upper conductive via 221. Further, the second upper periphery conductor 222 may taper upward, that is, a taper direction of the second upper periphery conductor 222 may be the same as the taper direction of the second upper conductive via 221. The taper direction of the second upper periphery conductor 222 may be different from the taper direction of the first upper periphery conductor 212. In addition, a lower portion of the second upper periphery conductor 222 of the second upper thermal conduction unit 22 is connected to an upper portion of the first upper periphery conductor 212 of the first upper thermal conduction unit 21 through, for example, a horizontally extending circuit layer 251. In some embodiments, the second upper periphery conductor 222 may include a fourth thermoelectric material, and a value of "Z×T" of the fourth thermoelectric material is greater than or equal to about 0.5, about 0.8, or about 1.0.

The material and type of the first thermoelectric material is the same as the material and type of the third thermoelectric material; and the material and type of the second thermoelectric material is the same as the material and type of the fourth thermoelectric material. For example, the first thermoelectric material and the third thermoelectric material may both be p-type semiconductor material, and the second thermoelectric material and the fourth thermoelectric material may both be n-type semiconductor material. Alternatively, the first thermoelectric material and the third thermoelectric material may both be n-type semiconductor material, and the second thermoelectric material and the fourth thermoelectric material may both be p-type semiconductor material.

The second upper isolation material 223 is interposed between the second upper conductive via 221 and the second upper periphery conductor 222. As shown in FIG. 2, the second upper isolation material 223 is disposed in a hole defined by the second upper periphery conductor 222. The second upper conductive via 221 is disposed in a hole defined by the second upper isolation material 223. The second upper conductive via 221 may define a central hole. That is, the second upper conductive via 221 may be a hollow structure. In addition, the second upper periphery conductor 222 extends through the first dielectric layer 26; thus, the second upper periphery conductor 222, the second upper isolation material 223 and the upper portion 221$a$ of the second upper conductive via 221 are disposed in the first dielectric layer 26. Further, the lower portion 221$b$ of the second upper conductive via 221 is disposed in the second dielectric layer 28.

The structures of the third upper thermal conduction unit 23 and the fourth upper thermal conduction unit 24 are similar with the structures of the second upper thermal conduction unit 22 and the first upper thermal conduction unit 21, respectively. In one embodiment, the structure of the third upper thermal conduction unit 23 and the fourth upper thermal conduction unit 24 is substantially a mirror reflection of the structure of the second upper thermal conduction unit 22 and the first upper thermal conduction unit 21. The third upper thermal conduction unit 23 is substantially symmetrical to the second upper thermal conduction unit 22, and the fourth upper thermal conduction unit 24 is substantially symmetrical to the first upper thermal conduction unit 21.

The third upper thermal conduction unit 23 includes a third upper conductive via 231, a third upper periphery conductor 232 and a third upper isolation material 233. The third upper conductive via 231 includes a fifth thermoelectric material. The structure of the third upper conductive via 231 may be substantially same as the structure of the second upper conductive via 221, and the fifth thermoelectric material may be same as the third thermoelectric material of the second upper conductive via 221. Further, the third upper periphery conductor 232 encloses or surrounds the third upper conductive via 231, and includes a sixth thermoelectric material. The structure of the third upper periphery conductor 232 may be substantially same as the structure of the second upper periphery conductor 222, and the sixth thermoelectric material may be same as the fourth thermoelectric material of the second upper periphery conductor 222. Further, an end of the third upper periphery conductor 232 is electrically connected to or contacts an end of the third upper conductive via 231. In addition, the third upper isolation material 233 is interposed between the third upper conductive via 231 and the third upper periphery conductor 232. The material and structure of the third upper isolation material 233 may be substantially same as the material and structure of the second upper isolation material 223.

The fourth upper thermal conduction unit 24 includes a fourth upper conductive via 241, a fourth upper periphery conductor 242 and a fourth upper isolation material 243. The fourth upper conductive via 241 includes a seventh thermoelectric material. The structure of the fourth upper conductive via 241 may be substantially same as the structure of the first upper conductive via 211, and the seventh thermoelectric material may be same as the first thermoelectric material of the first upper conductive via 211. Further, the fourth upper periphery conductor 242 encloses or surrounds the fourth upper conductive via 241, and includes an eighth thermoelectric material. The structure of the fourth upper periphery conductor 242 may be substantially same as the structure of the first upper periphery conductor 212, and the eighth thermoelectric material may be same as the second thermoelectric material of the first upper periphery conductor 212. Further, an end of the fourth upper periphery conductor 242 is electrically connected to or contacts an end of the fourth upper conductive via 241. In addition, an upper portion of the fourth upper periphery conductor 242 of the fourth upper thermal conduction unit 24 is connected to a lower portion of the third upper periphery conductor 232 of the third upper thermal conduction unit 23 through, for example, a horizontally extending circuit layer 252. In addition, the fourth upper isolation material 243 is interposed between the fourth upper conductive via 241 and the fourth upper periphery conductor 242. The material and structure of the fourth upper isolation material 233 may be substantially same as the material and structure of the first upper isolation material 213.

As shown in FIG. 2, the upper patterned circuit layer 27 may include a seed layer and a conductive layer disposed on the seed layer. In some embodiments, the upper patterned circuit layer 27 may include a first pad portion 271, a second pad portion 272 and a third pad portion 273. The first pad portion 271 may electrically connect the second upper conductive via 221 and the third upper conductive via 231. For example, one end of the first pad portion 271 may extend into the central hole of the second upper conductive via 221 to contact the second upper conductive via 221, and the other end of the first pad portion 271 may extend into the central hole of the third upper conductive via 231 to contact the third upper conductive via 231. The second pad portion 272 may electrically connect or contact a lower end of the lower portion 211b of the first upper conductive via 211 and a lower end of the first upper periphery conductor 212. The third pad portion 273 may electrically connect or contact a lower end of a lower portion of the fourth upper conductive via 241 and a lower end of the fourth upper periphery conductor 242.

The dummy pads 201, 202, 203, 204 are disposed on a top surface of the first dielectric layer 26. The dummy pad 201 contacts the upper portion 211a of the first upper conductive via 211. The dummy pad 202 contacts an upper portion of the second upper periphery conductor 222. The dummy pad 203 contacts an upper portion of the third upper periphery conductor 232. The dummy pad 204 contacts an upper portion of the fourth upper conductive via 241. The first protection layer 291 (e.g., a solder resist layer) covers the top surface of the first dielectric layer 26 and the dummy pads 201, 202, 203, 204. The second protection layer 292 (e.g., a solder resist layer) covers the bottom surface of the second dielectric layer 28 and the upper patterned circuit layer 27, and defines a plurality of openings to expose the first pad portion 271, the second pad portion 272 and the third pad portion 273. The interconnection elements 42 (e.g., solder balls) are disposed in the openings of the second protection layer 292 to contact the first pad portion 271, the second pad portion 272 and the third pad portion 273.

A structure of the electrical-to-thermal energy conversion apparatus 3 is similar with a structure of the thermal-to-electrical energy conversion apparatus 2. In one embodiment, a structure of the electrical-to-thermal energy conversion apparatus 3 is substantially a mirror reflection of the thermal-to-electrical energy conversion apparatus 2. The electrical-to-thermal energy conversion apparatus 3 is substantially symmetrical to the thermal-to-electrical energy conversion apparatus 2. In addition, the electrical-to-thermal energy conversion apparatus 3 may be electrically isolated from the thermal-to-electrical energy conversion apparatus 2. Alternatively, the electrical-to-thermal energy conversion apparatus 3 may be electrically connected to the thermal-to-electrical energy conversion apparatus 2.

The electrical-to-thermal energy conversion apparatus 3 is used for converting electrical energy into thermal energy, and includes a plurality of lower thermal conduction units (including, for example, a first lower thermal conduction unit 31, a second lower thermal conduction unit 32, a third lower thermal conduction unit 33 and a fourth lower thermal conduction unit 34) electrically connected to one another in series, a first dielectric layer 36, a second dielectric layer 38 on the first dielectric layer 36, a plurality of dummy pads 301, 302, 303, 304, a first protection layer 391, an lower patterned circuit layer 37 and a second protection layer 392.

The first lower thermal conduction unit 31 includes a first lower conductive via 311, a first lower periphery conductor 312 and a first lower isolation material 313. As shown in FIG. 2, the first lower conductive via 311 may include an upper portion 311a and a lower portion 311b with a boundary therebetween, and may taper downward. The lower portion 311b extends through the first dielectric layer 36. In some embodiments, the first lower conductive via 311 may include a first thermoelectric material, and a value of "Z×T" of the first thermoelectric material is greater than or equal to about 0.5, about 0.8, or about 1.0.

Further, the first lower periphery conductor 312 encloses or surrounds the first lower conductive via 311, and an end of the first lower periphery conductor 312 is electrically connected to or contacts an end of the first lower conductive via 311. As shown in FIG. 2, the first lower periphery conductor 312 encloses or surrounds the upper portion 311a of the first lower conductive via 311. Further, the first lower periphery conductor 312 may taper upward. In some embodiments, the first lower periphery conductor 312 may include a second thermoelectric material, and a value of "Z×T" of the second thermoelectric material is greater than or equal to about 0.5, about 0.8, or about 1.0.

The first lower isolation material 313 is interposed between the first lower conductive via 311 and the first lower periphery conductor 312. As shown in FIG. 2, the first lower periphery conductor 312 defines a hole 3121, and the first lower isolation material 313 is disposed in the hole 3121. The first lower isolation material 313 defines a hole 3131, and the first lower conductive via 311 is disposed in the hole 3131. The first lower conductive via 311 may define a central hole 3111. In addition, the upper portion 311a of the first lower conductive via 311, the first lower periphery conductor 312 and the first lower isolation material 313 are disposed in the second dielectric layer 38. A portion of the second dielectric layer 38 extends into the central hole 3111 of the first lower conductive via 311.

The second lower thermal conduction unit 32 includes a second lower conductive via 321, a second lower periphery conductor 322 and a second lower isolation material 323. As shown in FIG. 2, the second lower conductive via 321 may include an upper portion 321a and a lower portion 321b with a boundary therebetween, and may taper downward. In some embodiments, the second lower conductive via 321 may include a third thermoelectric material, and a value of "Z×T" of the third thermoelectric material is greater than or equal to about 0.5, about 0.8, or about 1.0.

Further, the second lower periphery conductor 322 encloses or surrounds the second lower conductive via 321, and an end of the second lower periphery conductor 322 is electrically connected to or contacts an end of the second lower conductive via 321. As shown in FIG. 2, the second lower periphery conductor 322 surrounds or encloses the lower portion 321b of the second lower conductive via 321. Further, the second lower periphery conductor 322 may taper downward, that is, a taper direction of the second lower periphery conductor 322 may be the same as the taper direction of the second lower conductive via 321. In addition, an upper portion of the second lower periphery conductor 322 of the second lower thermal conduction unit 32 is connected to a lower portion of the first lower periphery conductor 312 of the first lower thermal conduction unit 31 through, for example, a horizontally extending circuit layer 351. In some embodiments, the second lower periphery conductor 322 may include a fourth thermoelectric material, and a value of "Z×T" of the fourth thermoelectric material is greater than or equal to about 0.5, about 0.8, or about 1.0.

The second lower isolation material 323 is interposed between the second lower conductive via 321 and the second lower periphery conductor 322. As shown in FIG. 2, the second lower isolation material 323 is disposed in a hole defined by the second lower periphery conductor 322. The second lower conductive via 321 is disposed in a hole defined by the second lower isolation material 323. The second lower conductive via 321 may define a central hole. That is, the second lower conductive via 321 may be a hollow structure. In addition, the second lower periphery conductor 322 extends through the first dielectric layer 36. Further, the upper portion 321a of the second lower conductive via 321 is disposed in the second dielectric layer 38.

The structures of the third lower thermal conduction unit 33 and the fourth lower thermal conduction unit 34 are similar with the structures of the second lower thermal conduction unit 32 and the first lower thermal conduction unit 31, respectively. In one embodiment, the structure of the third lower thermal conduction unit 33 and the fourth lower thermal conduction unit 34 is substantially a mirror reflection of the structure of the second lower thermal conduction unit 32 and the first lower thermal conduction unit 31. The third lower thermal conduction unit 33 is substantially symmetrical to the second lower thermal conduction unit 32, and the fourth lower thermal conduction unit 34 is substantially symmetrical to the first lower thermal conduction unit 31.

The third lower thermal conduction unit 33 includes a third lower conductive via 331, a third lower periphery conductor 332 and a third lower isolation material 333. The third lower conductive via 331 includes a fifth thermoelectric material. The structure of the third lower conductive via 331 may be substantially same as the structure of the second lower conductive via 321, and the fifth thermoelectric material may be same as the third thermoelectric material of the second lower conductive via 321. Further, the third lower periphery conductor 332 encloses or surrounds the third lower conductive via 331, and includes a sixth thermoelectric material. The structure of the third lower periphery conductor 332 may be substantially same as the structure of the second lower periphery conductor 322, and the sixth thermoelectric material may be same as the fourth thermoelectric material of the second lower periphery conductor 322. Further, an end of the third lower periphery conductor 332 is electrically connected to or contacts an end of the third lower conductive via 331. In addition, the third lower isolation material 333 is interposed between the third lower conductive via 331 and the third lower periphery conductor 332. The material and structure of the third lower isolation material 333 may be substantially same as the material and structure of the second lower isolation material 323.

The fourth lower thermal conduction unit 34 includes a fourth lower conductive via 341, a fourth lower periphery conductor 342 and a fourth lower isolation material 343. The fourth lower conductive via 341 includes a seventh thermoelectric material. The structure of the fourth lower conductive via 341 may be substantially same as the structure of the first lower conductive via 311, and the seventh thermoelectric material may be same as the first thermoelectric material of the first lower conductive via 311. Further, the fourth lower periphery conductor 342 encloses or surrounds the fourth lower conductive via 341, and includes an eighth thermoelectric material. The structure of the fourth lower periphery conductor 342 may be substantially same as the structure of the first lower periphery conductor 312, and the eighth thermoelectric material may be same as the second thermoelectric material of the first lower periphery conductor 312. Further, an end of the fourth lower periphery conductor 342 is electrically connected to or contacts an end of the fourth lower conductive via 341.

In addition, a lower portion of the fourth lower periphery conductor 342 of the fourth lower thermal conduction unit 34 is connected to an upper portion of the third lower periphery conductor 332 of the third lower thermal conduction unit 33 through, for example, a horizontally extending circuit layer 352. In addition, the fourth lower isolation material 343 is interposed between the fourth lower conductive via 341 and the fourth lower periphery conductor 342. The material and structure of the fourth lower isolation material 343 may be substantially same as the material and structure of the first lower isolation material 313.

As shown in FIG. 2, the lower patterned circuit layer 37 may include a seed layer and a conductive layer disposed on the seed layer. In some embodiments, the lower patterned circuit layer 37 may include a first pad portion 371, a second pad portion 372 and a third pad portion 373. The first pad portion 371 may electrically connect the second lower conductive via 321 and the third lower conductive via 331. For example, one end of the first pad portion 371 may extend into the central hole of the second lower conductive via 321 to contact the second lower conductive via 321, and the other end of the first pad portion 371 may extend into the central hole of the third lower conductive via 331 to contact the third lower conductive via 331. The second pad portion 372 may electrically connect or contact an upper end of the upper portion 311a of the first lower conductive via 311 and an upper end of the first lower periphery conductor 312. The third pad portion 373 may electrically connect or contact an upper end of an upper portion of the fourth lower conductive via 341 and an upper end of the fourth lower periphery conductor 342.

The dummy pads 301, 302, 303, 304 are disposed on a bottom surface of the first dielectric layer 36. The dummy pad 301 contacts the lower portion 311b of the first lower conductive via 311. The dummy pad 302 contacts a lower portion of the second lower periphery conductor 322. The dummy pad 303 contacts a lower portion of the third lower periphery conductor 332. The dummy pad 304 contacts a lower portion of the fourth lower conductive via 341. The first protection layer 391 (e.g., a solder resist layer) covers the bottom surface of the first dielectric layer 36 and the dummy pads 301, 302, 303, 304. The second protection layer 392 (e.g., having a high dielectric constant (high-k)) covers the top surface of the second dielectric layer 38 and the lower patterned circuit layer 37. The middle circuit layer 46 is disposed on the second protection layer 392, and includes a plurality of pads 461. The interconnection elements 42 are connected to the pads 461. The intermediate layer 44 (e.g., an underfill) is interposed between the electrical-to-thermal energy conversion apparatus 3 and the thermal-to-electrical energy conversion apparatus 2 to cover and protect the interconnection elements 42 and the middle circuit layer 46.

Figure 3:
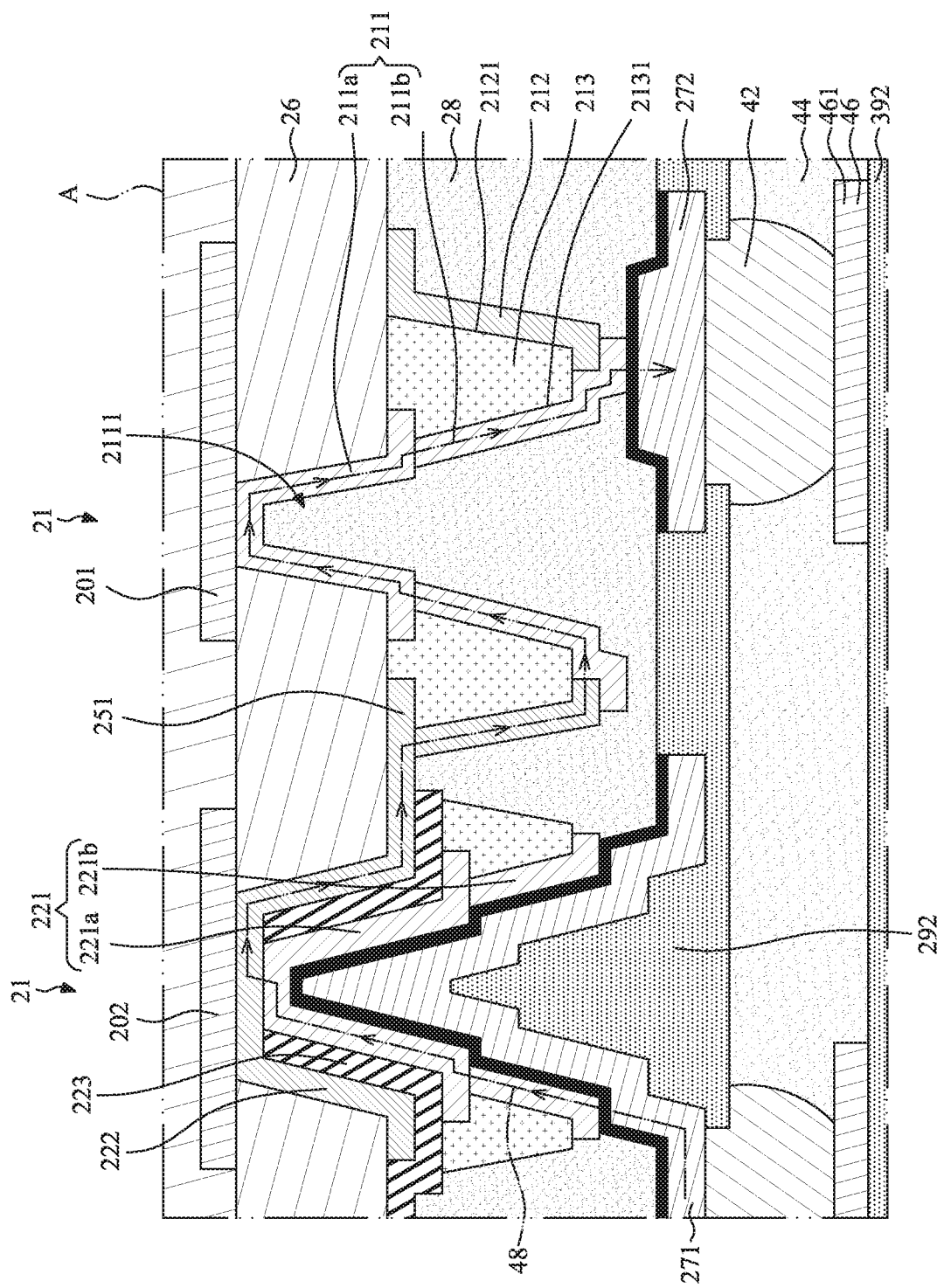
FIG. 3 illustrates an enlarged view of a region "A" in FIG. 2.

FIG. 3 illustrates an enlarged view of a region "A" in FIG. 2. During the operation of the semiconductor chip 12 (FIG. 1), the heat generated by the semiconductor chip 12 may be transmitted from the top side of the thermal-to-electrical energy conversion apparatus 2 to the bottom side of the thermal-to-electrical energy conversion apparatus 2. Thus, a Seebeck voltage and an electrical current 48 will be generated between the first pad portion 271 and the second pad portion 272 according to the Seebeck effect. As shown in FIG. 3, the first pad portion 271 has a high voltage, and the second pad portion 272 has a low voltage (or zero voltage); thus, the electrical current 48 may flow from the first pad portion 271 to the second pad portion 272 through the second upper conductive via 221, the second upper periphery conductor 222, the circuit layer 251, the first upper periphery conductor 212 and the first upper conductive via 211.

Figure 4:
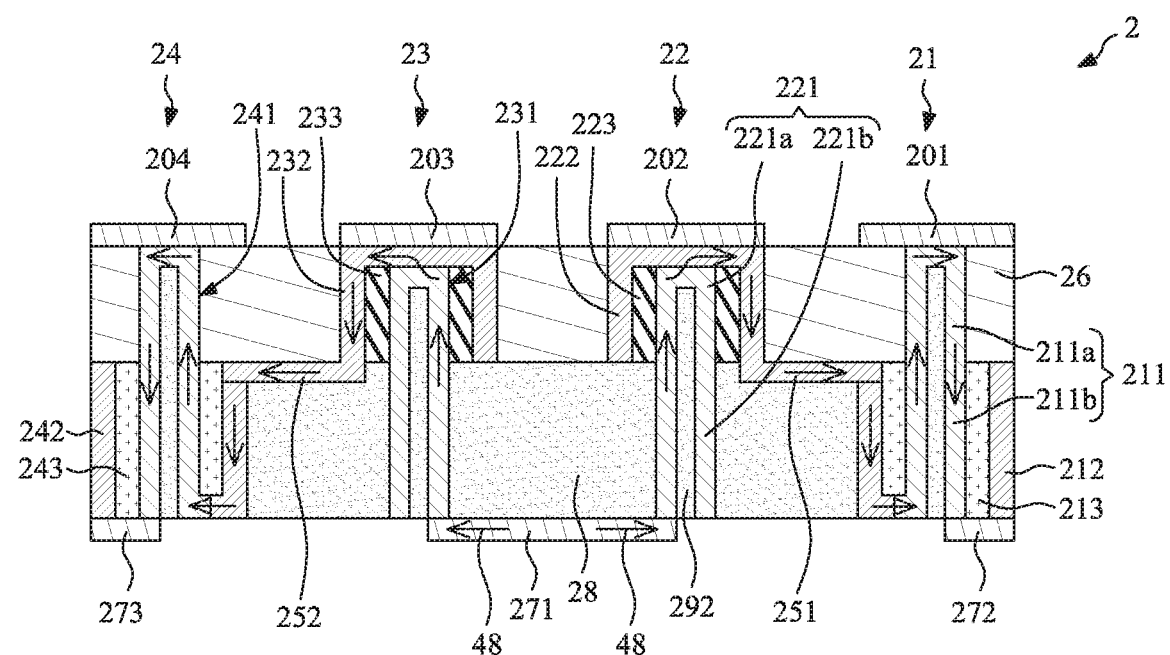
FIG. 4 illustrates an exemplary circuit schematic diagram of the thermal-to-electrical energy conversion apparatus of FIG. 2.

FIG. 4 illustrates an exemplary circuit schematic diagram of the thermal-to-electrical energy conversion apparatus 2 of FIG. 2. As shown in FIG. 4, the third pad portion 273 has a low voltage (or zero voltage); thus, the electrical current 48 may also flow from the first pad portion 271 to the third pad portion 273 through the third upper conductive via 231, the third upper periphery conductor 232, the circuit layer 252, the fourth upper periphery conductor 242 and the fourth upper conductive via 241.

Figure 5:
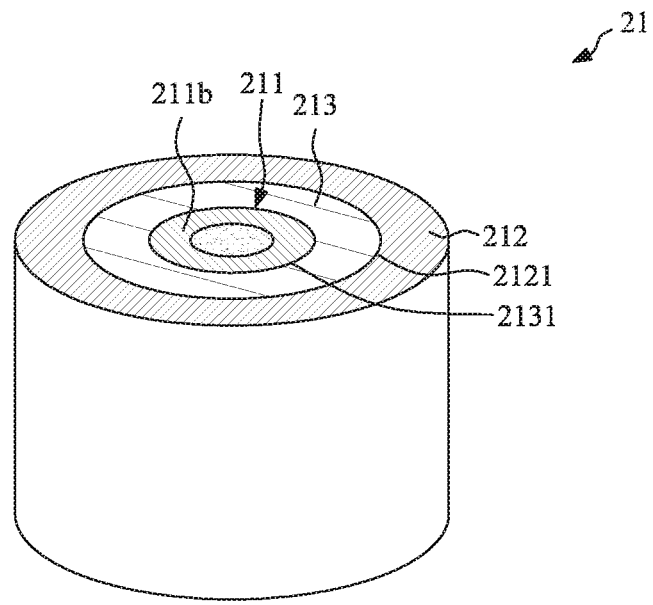
FIG. 5 illustrates an enlarged perspective view of a lower portion of the first upper thermal conduction unit of the thermal-to-electrical energy conversion apparatus of FIG. 4.

FIG. 5 illustrates an enlarged perspective view of a lower portion of the first upper thermal conduction unit 21 of the thermal-to-electrical energy conversion apparatus 2 of FIG. 4. As shown in FIG. 5, a lower portion of the first upper thermal conduction unit 21 may be substantially "cylinder shaped" or "cone shaped". Further, the upper portion of the second upper thermal conduction unit 22 may also be substantially "cylinder shaped" or "cone shaped". Similarly, the upper portion of the third upper thermal conduction unit 23 and the lower portion of the fourth upper thermal conduction unit 24 may also be substantially "cylinder shaped" or "cone shaped". Taking the first upper thermal conduction unit 21 for example, the first upper conductive via 211 is enclosed or surrounded by the first upper periphery conductor 212. Thus, the first upper thermal conduction unit 21 includes a pair of conductors in a pillar-like structure. In a comparative embodiment, a thermal conduction unit may include two pillar-like structures with different conductors. Therefore, the size of the thermal-to-electrical energy conversion apparatus 2 may be reduced efficiently.

Figure 6:
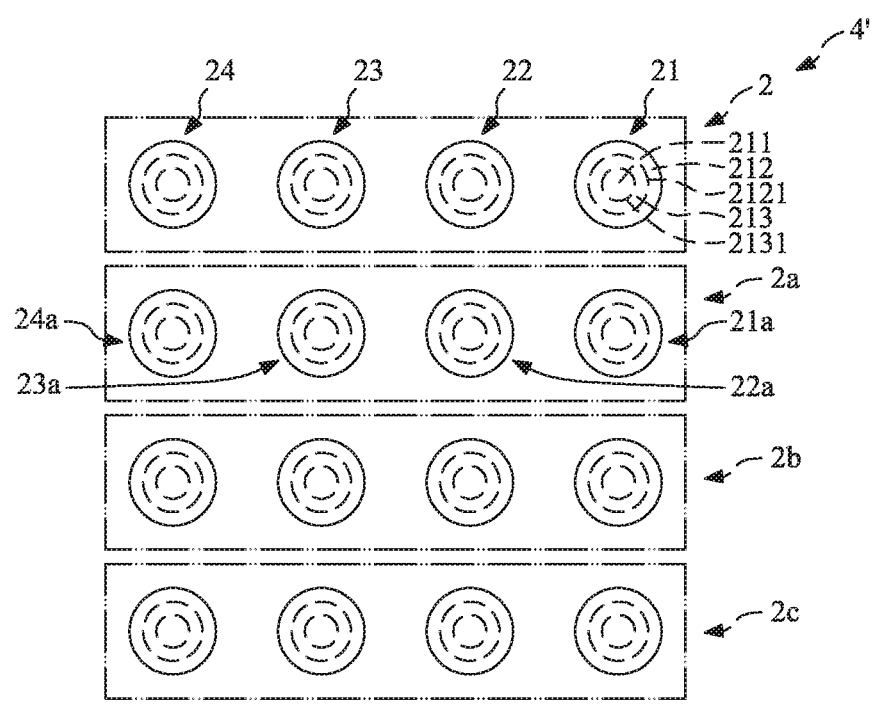
FIG. 6 illustrates a schematic view of a heat dissipating module according to some embodiments of the present disclosure.

FIG. 6 illustrates a schematic view of a heat dissipating module 4' according to some embodiments of the present disclosure. The heat dissipating module 4' may include a plurality of thermal-to-electrical energy conversion apparatuses 2, 2a, 2b, 2c arranged side by side. The thermal-to-electrical energy conversion apparatuses 2, 2a, 2b, 2c may be similar with each other. For example, the thermal-to-electrical energy conversion apparatus 2a may include a first upper thermal conduction unit 21a, a second upper thermal conduction unit 22a, a third upper thermal conduction unit 23a and a fourth upper thermal conduction unit 24a. Thus, the thermal conduction units (including, for example, the first upper thermal conduction unit 21, 21a, the second upper thermal conduction unit 22, 22a, the third upper thermal conduction unit 23, 23a and the fourth upper thermal conduction unit 24, 24a) may be arranged in an array.

Referring FIG. 1 and FIG. 2, the hi-k second protection layer 392 is interposed between the middle circuit layer 46 and the lower patterned circuit layer 37 so as to form a capacitor. Thus, during the operation of the semiconductor chip 12, an induced electrical current will be generated in the lower patterned circuit layer 37 corresponding to the electrical current 48 (FIG. 3 and FIG. 4) in the thermal-to-electrical energy conversion apparatus 2. Since the electrical-to-thermal energy conversion apparatus 3 can convert electrical energy into thermal energy, the heat may be transmitted from the top side of the electrical-to-thermal energy conversion apparatus 3 to the bottom side of the electrical-to-thermal energy conversion apparatus 3 according to the Peltier effect. As shown in FIG. 2, for example, the second pad portion 372 may have a high voltage, and the first pad portion 371 may have a low voltage (or zero voltage); thus, the induced electrical current may flow from the second pad portion 372 to the first pad portion 371 through the first lower conductive via 311, the first lower periphery conductor 312, the circuit layer 351, the second lower periphery conductor 322 and the second lower conductive via 321.

Referring FIG. 1, during the operation of the semiconductor chip 12, the heat generated by the semiconductor chip 12 may be transmitted from the top surface 101 of the substrate 10 to the bottom surface 102 of the substrate 10 through the heat dissipating device 4 (including the thermal-to-electrical energy conversion apparatus 2 and the electrical-to-thermal energy conversion apparatus 3) quickly. Then, the heat may be dissipated away from the semiconductor package structure 1. That is, the heat dissipating device 4 may be used to prevent the semiconductor package structure 1 (including the semiconductor chip 12 and the substrate 10) from being over-heated. Thus, the maximum temperature of the semiconductor package structure 1 (including the semiconductor chip 12 and the substrate 10) may be lowered (or may be not too high), which may obtain a substantially uniform temperature distribution in the substrate 10. As a result, the warpage of the substrate 10 is reduced, and the crack between the internal connectors 14 and the bonding pads 107 of the substrate 10 may be avoided. Further, the delamination between the dielectric layers 104a, 104b, 104c, 104d, 104e and the circuit layers 105a, 105b, 105c, 105d, 105e may also be avoided. Therefore, the working life and reliability of the semiconductor package structure 1 may be improved. In addition, the heat dissipating device 4 may be manufactured by the redistribution layer (RDL) technique. Thus, the size of the heat dissipating device 4 may be reduced efficiently.

Figure 7:
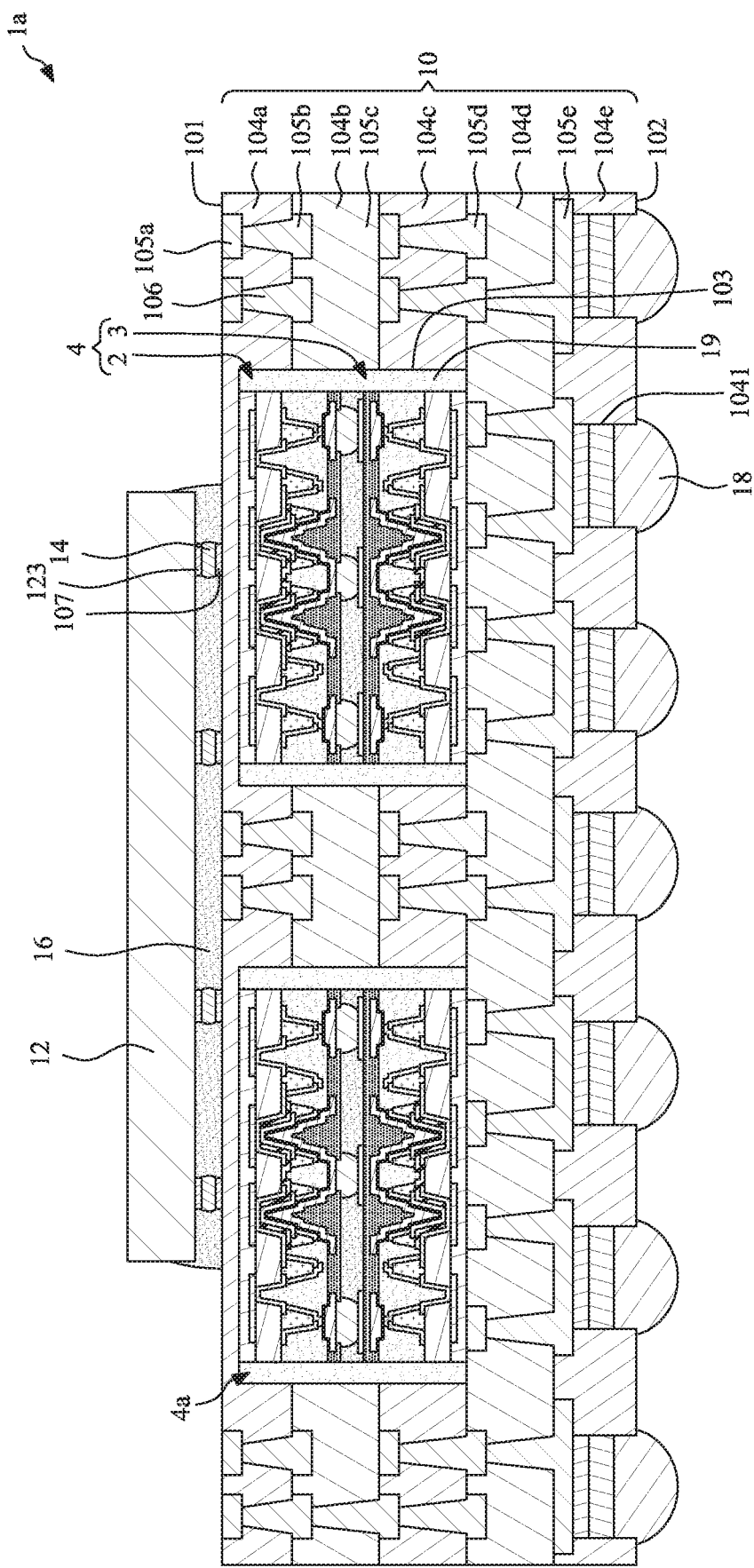
FIG. 7 illustrates a cross-sectional view of a semiconductor package structure according to some embodiments of the present disclosure.

FIG. 7 illustrates a cross-sectional view of a semiconductor package structure 1a according to some embodiments of the present disclosure. The semiconductor package structure 1a is similar to the semiconductor package structure 1 shown in FIG. 1, except that a heat dissipating device 4a is further included or embedded in the substrate 10. The structure of the heat dissipating device 4a may be substantially the same as the structure of the heat dissipating device 4. The heat dissipating device 4a and the heat dissipating device 4 are disposed side by side.

Figure 8:
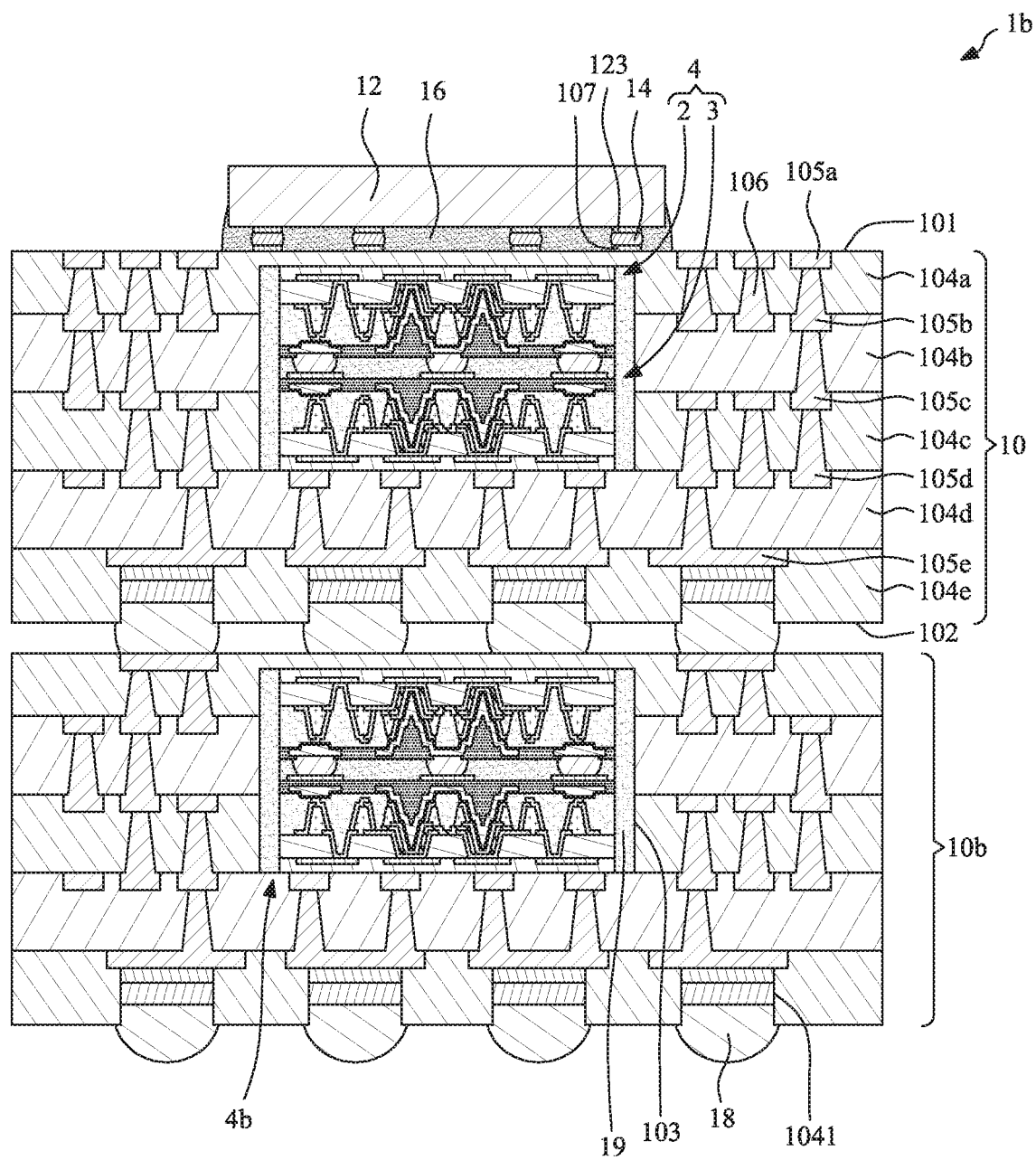
FIG. 8 illustrates a cross-sectional view of a semiconductor package structure according to some embodiments of the present disclosure.

FIG. 8 illustrates a cross-sectional view of a semiconductor package structure 1b according to some embodiments of the present disclosure. The semiconductor package structure 1b is similar to the semiconductor package structure 1 shown in FIG. 1, and the differences are described as follows. The semiconductor package structure 1b further includes a substrate 10b and a heat dissipating device 4b embedded in the substrate 10b. The structures of the substrate 10b and the heat dissipating device 4b may be substantially the same as the structures of the substrate 10 and the heat dissipating device 4, respectively. The substrate 10b is electrically connected to the bottom surface 102 of the substrate 10. Thus, the heat dissipating device 4b is disposed under the heat dissipating device 4.

Figure 9:
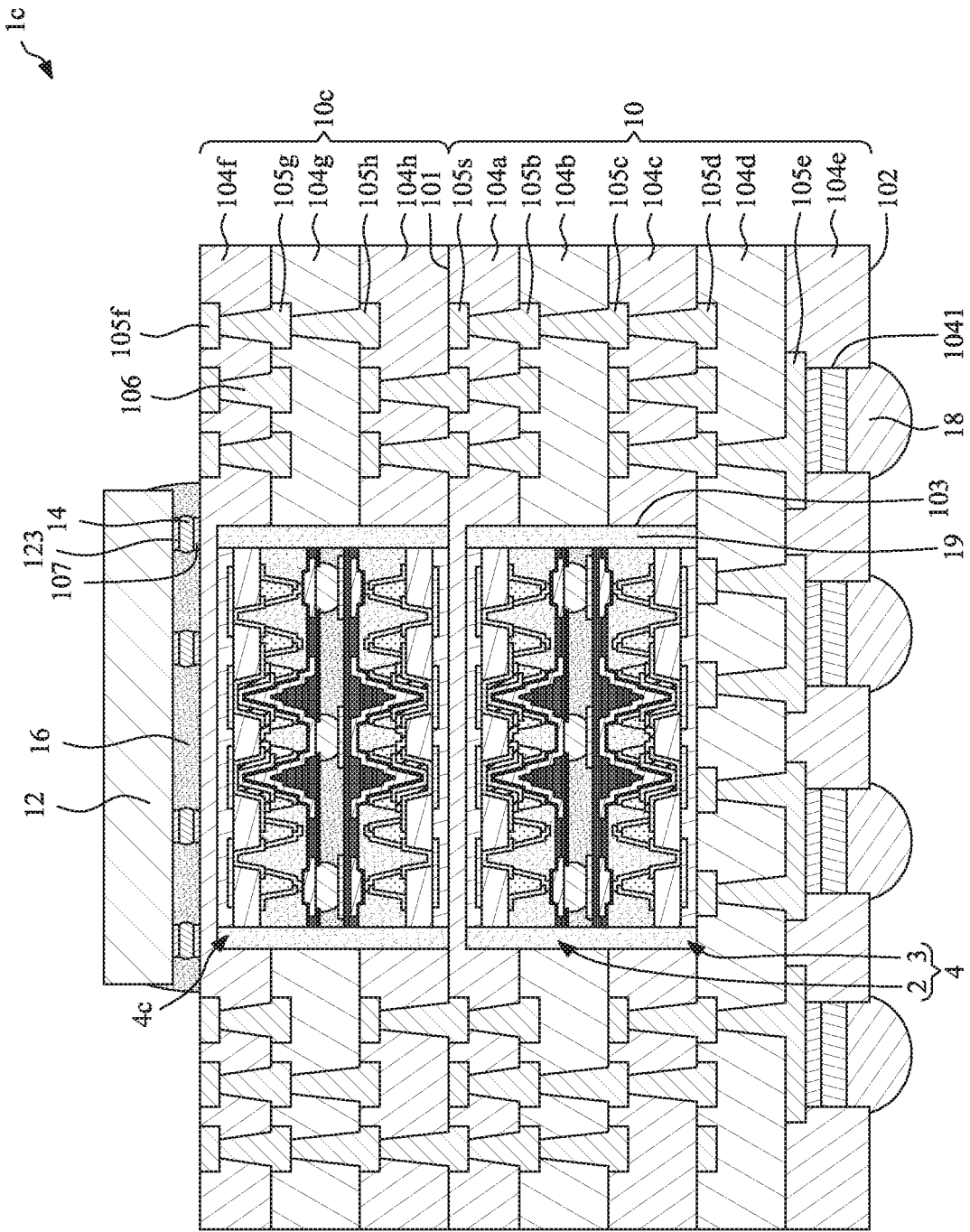
FIG. 9 illustrates a cross-sectional view of a semiconductor package structure according to some embodiments of the present disclosure.

FIG. 9 illustrates a cross-sectional view of a semiconductor package structure 1c according to some embodiments of the present disclosure. The semiconductor package structure 1c is similar to the semiconductor package structure 1 shown in FIG. 1, and the differences are described as follows. The semiconductor package structure 1c further includes a substrate 10c and a heat dissipating device 4c embedded in the substrate 10c. The substrate 10c includes a plurality of dielectric layers 104f, 104g, 104h and a plurality of circuit layers 105f, 105g, 105h in contact with the dielectric layers 104f, 104g, 104h. The substrate 10 is formed on the substrate 10c. The structure of the heat dissipating device 4c may be substantially the same as the structure of the heat dissipating device 4. Thus, the heat dissipating device 4 is disposed under the heat dissipating device 4c. The semiconductor chip 12 is electrically connected to the circuit layer 105f adjacent to the top surface of the substrate 10c through the internal connectors 14 (e.g., solder balls).

Figure 10:
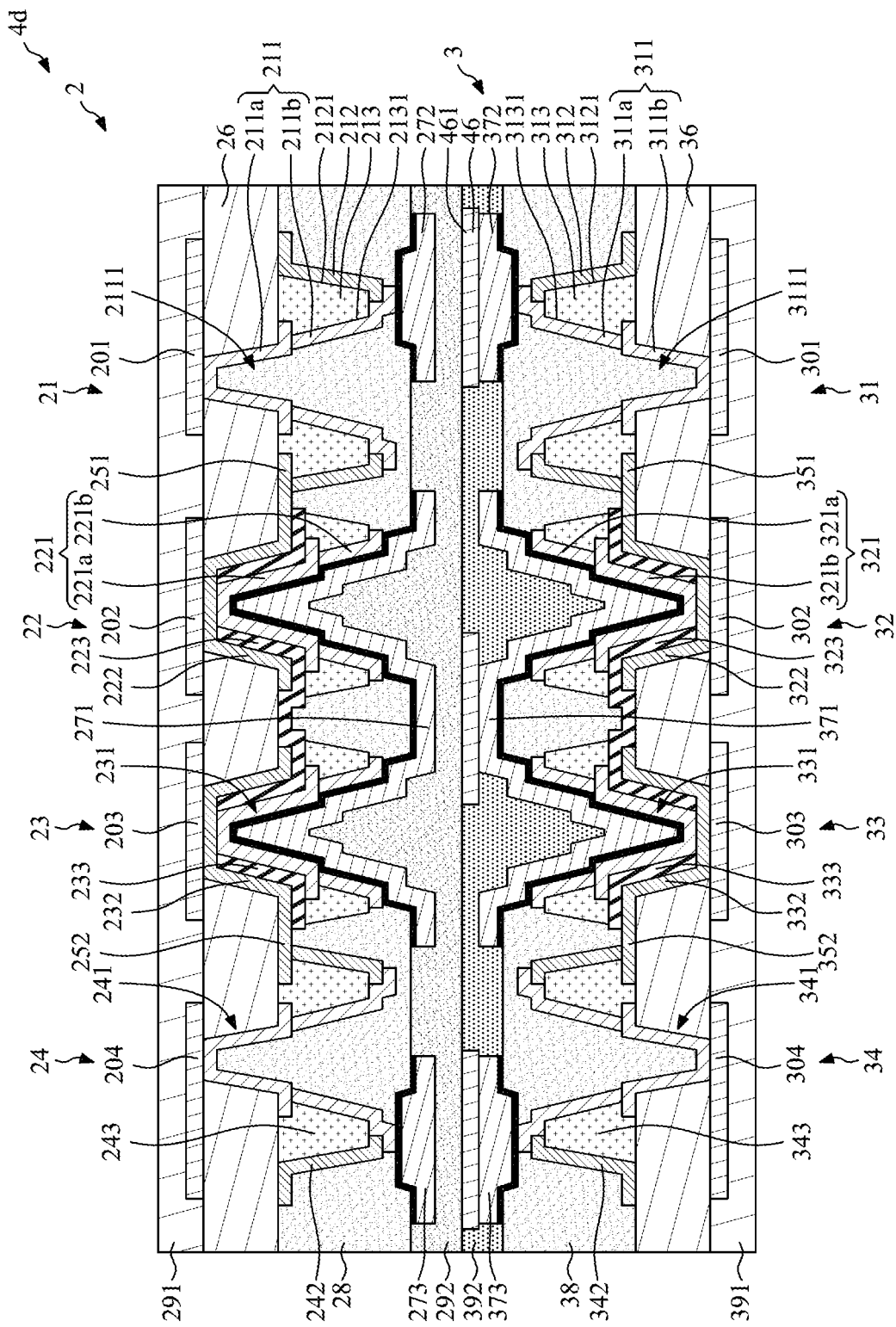
FIG. 10 illustrates a cross-sectional view of a heat dissipating device according to some embodiments of the present disclosure.

FIG. 10 illustrates a cross-sectional view of a heat dissipating device 4d according to some embodiments of the present disclosure. The heat dissipating device 4d is similar to the heat dissipating device 4 shown in FIG. 2, and the differences are described as follows. As shown in FIG. 10, the interconnection elements 42 and the intermediate layer 44 of FIG. 2 are omitted. Further, the middle circuit layer 46 may contact the lower patterned circuit layer 37 (including the first pad portion 371, the second pad portion 372 and the third pad portion 373). Thus, the second protection layer 292 may contact the second protection layer 392. In addition, the second protection layer 292 may be a hi-k dielectric material.

Figure 11:
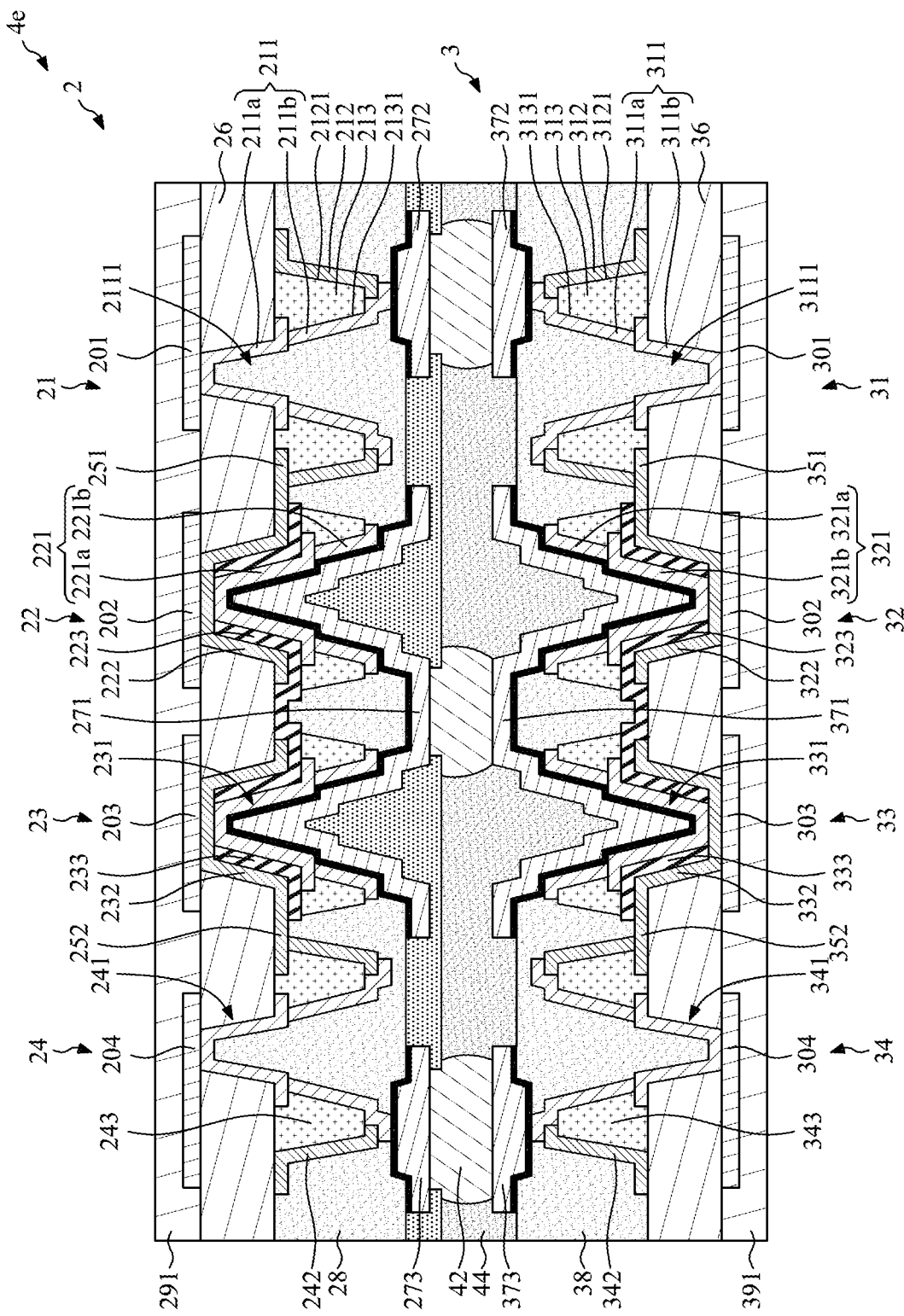
FIG. 11 illustrates a cross-sectional view of a heat dissipating device according to some embodiments of the present disclosure.

FIG. 11 illustrates a cross-sectional view of a heat dissipating device 4e according to some embodiments of the present disclosure. The heat dissipating device 4e is similar to the heat dissipating device 4 shown in FIG. 2, and the differences are described as follows. As shown in FIG. 11, the middle circuit layer 46 and the second protection layer 392 of FIG. 2 are omitted. Thus, the interconnection elements 42 may contact the lower patterned circuit layer 37 (including the first pad portion 371, the second pad portion 372 and the third pad portion 373) directly. The intermediate layer 44 may cover and protect the interconnection elements 42 and the lower patterned circuit layer 37.

Figure 12:
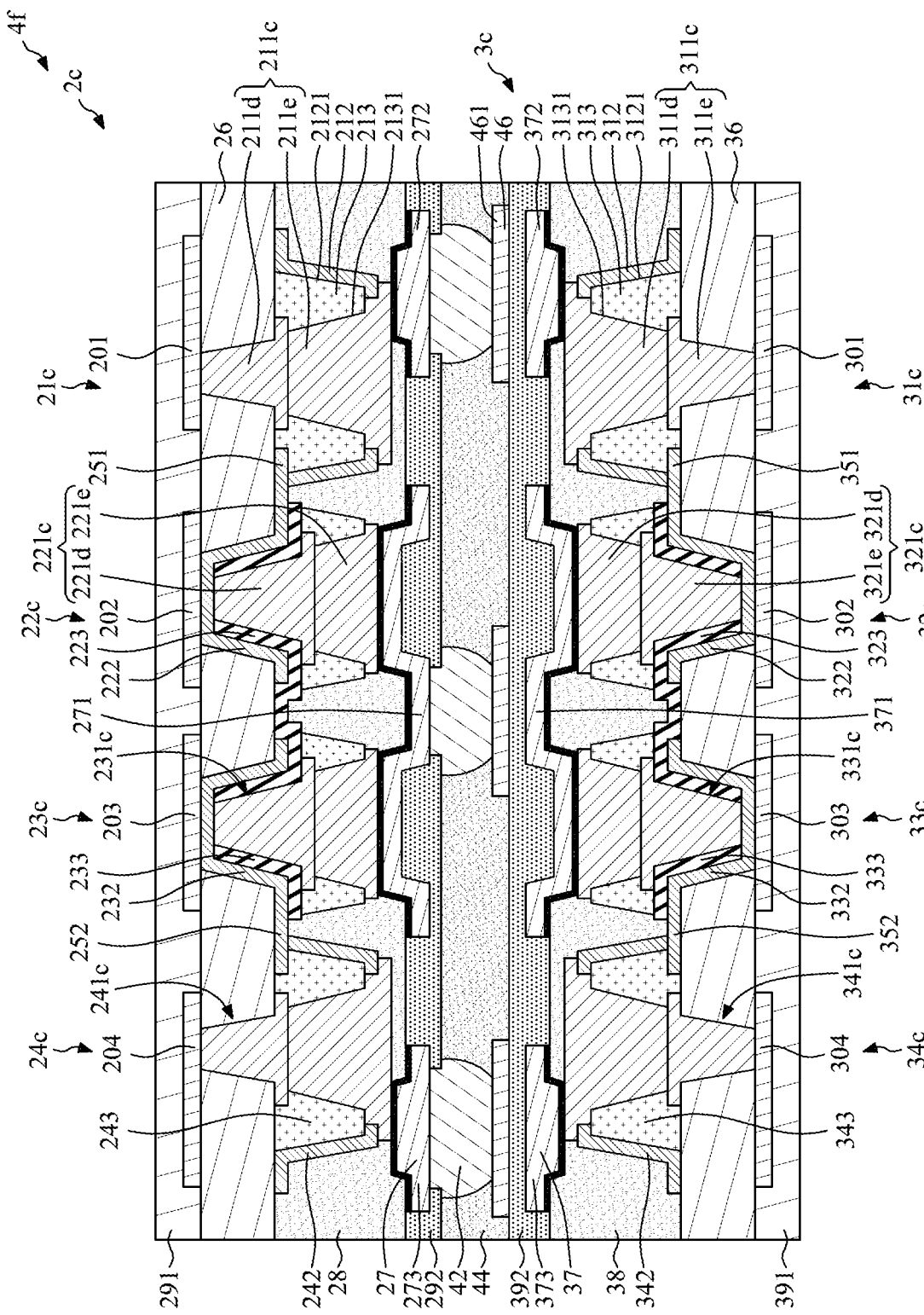
FIG. 12 illustrates a cross-sectional view of a heat dissipating device according to some embodiments of the present disclosure.

FIG. 12 illustrates a cross-sectional view of a heat dissipating device 4f according to some embodiments of the present disclosure. The heat dissipating device 4f is similar to the heat dissipating device 4 shown in FIG. 2, and the differences are described as follows. As shown in FIG. 12, the upper portion 211d and the lower portion 211e of the first upper conductive via 211c of the first upper thermal conduction unit 21c of the thermal-to-electrical energy conversion apparatus 2c are solid structures rather than hollow structures. Thus, the first upper conductive via 211c may not define a central hole. Further, the upper portion 221d and the lower portion 221e of the second upper conductive via 221c of the second upper thermal conduction unit 22c of the thermal-to-electrical energy conversion apparatus 2c are solid structures. In addition, the third upper conductive via 231c of the third upper thermal conduction unit 23c and the fourth upper conductive via 241c of the fourth upper thermal conduction unit 24c are solid structures. Similarly, the upper portion 311d and the lower portion 311e of the first lower conductive via 311c of the first lower thermal conduction unit 31c, and the upper portion 321d and the lower portion 321e of the second lower conductive via 321c of the second lower thermal conduction unit 32c of the electrical-to-thermal energy conversion apparatus 3c are solid structures. In addition, the third lower conductive via 331c of the third lower thermal conduction unit 33c and the fourth lower conductive via 341c of the fourth lower thermal conduction unit 34c are solid structures.

Figure 13:
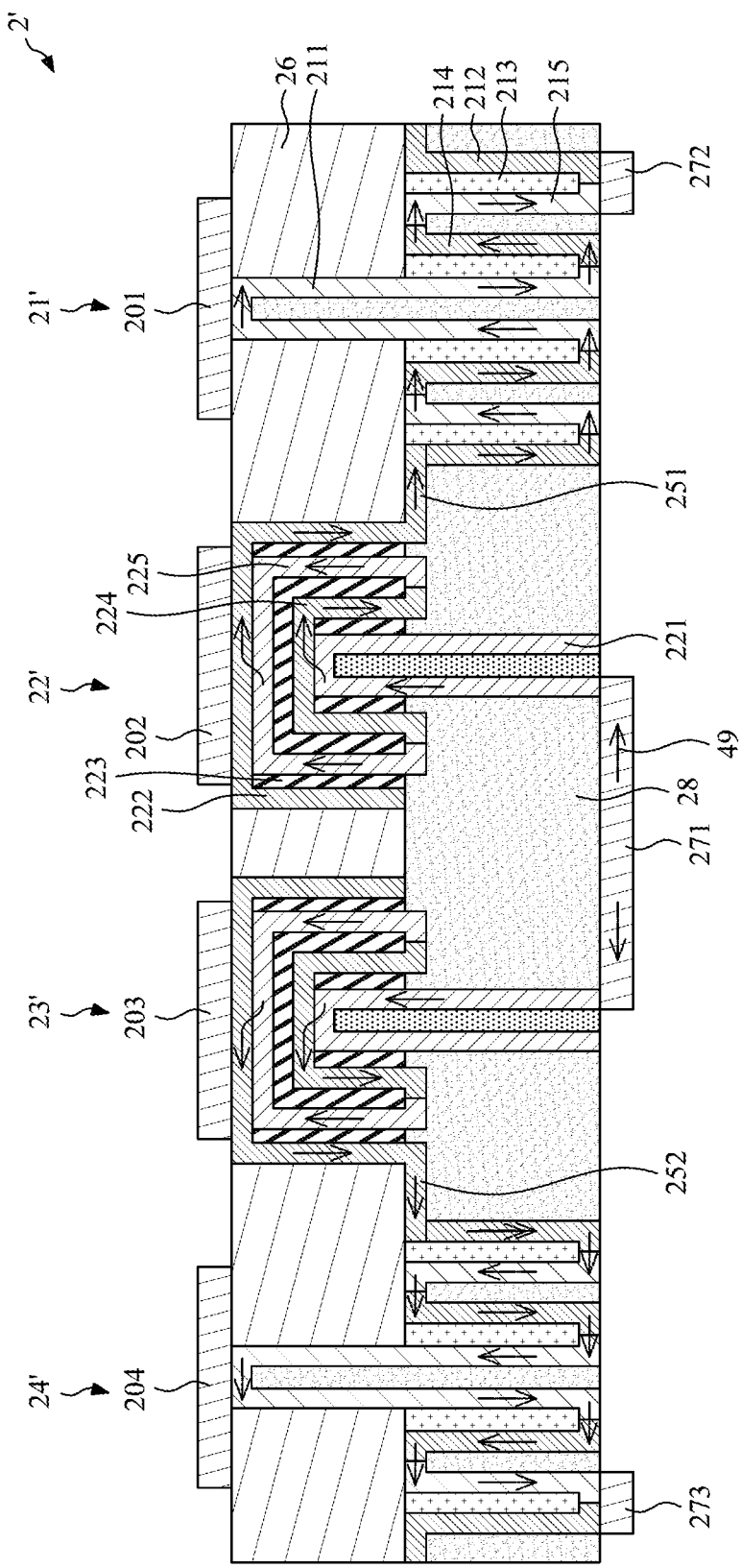
FIG. 13 illustrates an exemplary circuit schematic diagram of a thermal-to-electrical energy conversion apparatus according to some embodiments of the present disclosure.

FIG. 13 illustrates an exemplary circuit schematic diagram of a thermal-to-electrical energy conversion apparatus 2' according to some embodiments of the present disclosure. The thermal-to-electrical energy conversion apparatus 2' is similar to the thermal-to-electrical energy conversion apparatus 2 shown in FIG. 1 to FIG. 6, and the differences are described as follows. The thermal-to-electrical energy conversion apparatus 2' includes a plurality of upper thermal conduction units (including, for example, a first upper thermal conduction unit 21', a second upper thermal conduction unit 22', a third upper thermal conduction unit 23' and a fourth upper thermal conduction unit 24') electrically connected to one another in series. For example, the first upper thermal conduction unit 21' further includes a first upper surrounding conductor 214, a first upper inner via 215 and two isolation materials. The first upper surrounding conductor 214 encloses or surrounds the first upper conductive via 211, and an isolation material is disposed therebetween. The first upper inner via 215 encloses or surrounds the first upper surrounding conductor 214, and an isolation material is disposed therebetween. The first upper periphery conductor 212 encloses or surrounds the first upper inner via 215, and the first upper isolation material 213 is disposed therebetween. A material of the first upper conductive via 211 may be the same as a material of the first upper inner via 215, and a material of the first upper surrounding conductor 214 may be the same as a material of the first upper periphery conductor 212. In addition, the second upper thermal conduction unit 22' further includes a second upper surrounding conductor 224, a second upper inner via 225 and two isolation materials. The second upper surrounding conductor 224 encloses or surrounds the second upper conductive via 221, and an isolation material is disposed therebetween. The second upper inner via 225 encloses or surrounds the second upper surrounding conductor 224, and an isolation material is disposed therebetween. The second upper periphery conductor 222 encloses or surrounds the second upper inner via 225, and the second upper isolation material 223 is disposed therebetween. A material of the second upper conductive via 221 may be the same as a material of the second upper inner via 225, and a material of the second upper surrounding conductor 224 may be the same as a material of the second upper periphery conductor 222. According to the Seebeck effect, an electrical current 49 may flow from the first pad portion 271 to the second pad portion 272 through the second upper conductive via 221, the second upper surrounding conductor 224, the second upper inner via 225, the second upper periphery conductor 222, the circuit layer 251, the first upper periphery conductor 212, the first upper inner via 215, the first upper surrounding conductor 214 and the first upper conductive via 211.

FIG. 14 through FIG. 48 illustrate a method for manufacturing a heat dissipating device according to some embodiments of the present disclosure. In some embodiments, the method is for manufacturing the heat dissipating device 4 shown in FIG. 1 and FIG. 2.

Figure 14:
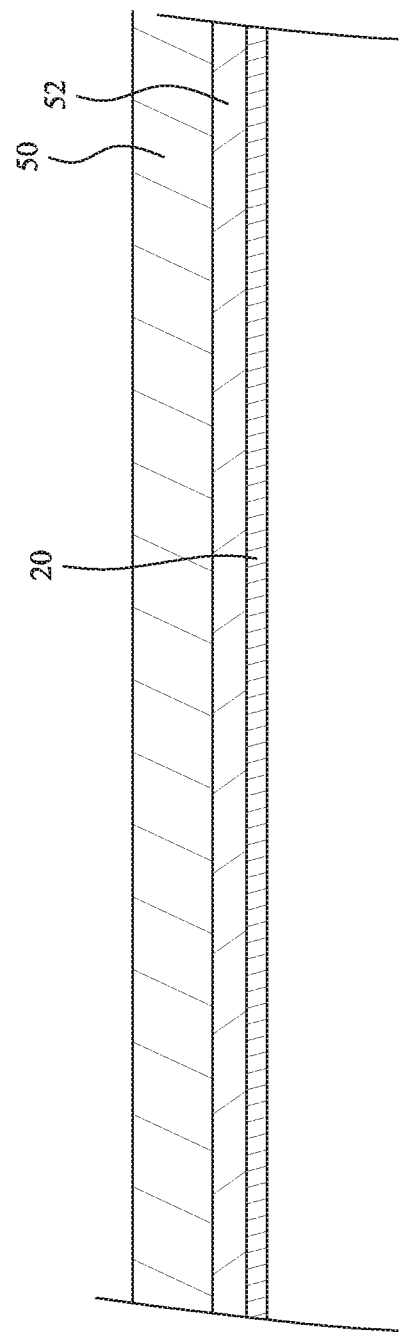
FIG. 14 illustrates one or more stages of an example of a method for manufacturing a heat dissipating device according to some embodiments of the present disclosure.

Referring to FIG. 14, a carrier 50 with a release layer 52 is provided. The carrier 50 may be, for example, a metal material, a ceramic material, a glass material, a substrate or a semiconductor wafer. The shape of the carrier 50 may be, for example, rectangular or square. Alternatively, the shape of the carrier 50 may be, for example, circular or elliptical. Then, a metal layer 20 (e.g., copper layer) is formed on the release layer 52.

Figure 15:
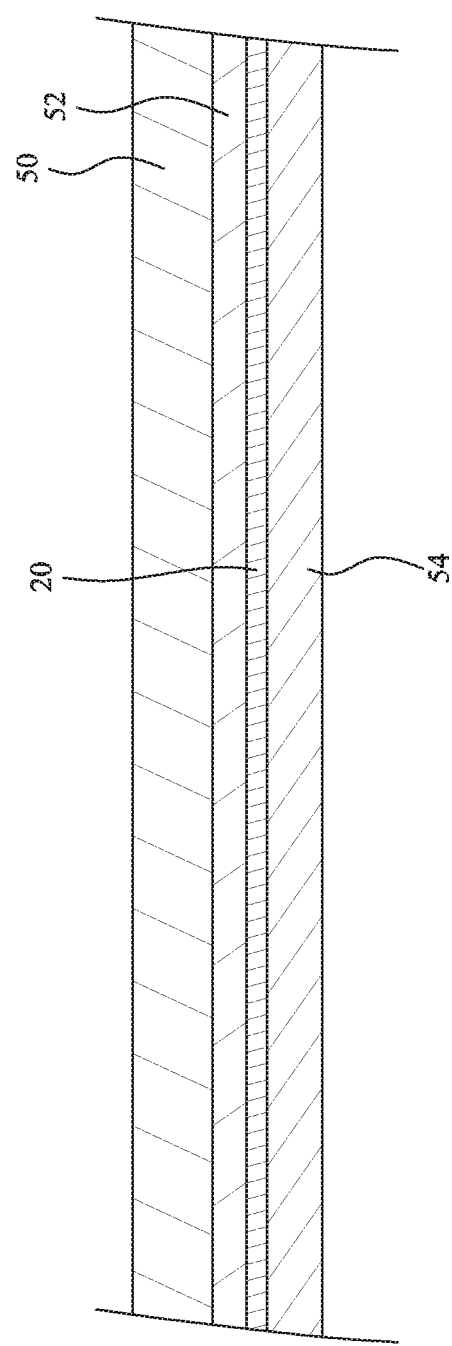
FIG. 15 illustrates one or more stages of an example of a method for manufacturing a heat dissipating device according to some embodiments of the present disclosure.

Referring to FIG. 15, a photoresist layer 54 is formed or disposed on the metal layer 20 by, for example, coating.

Figure 16:
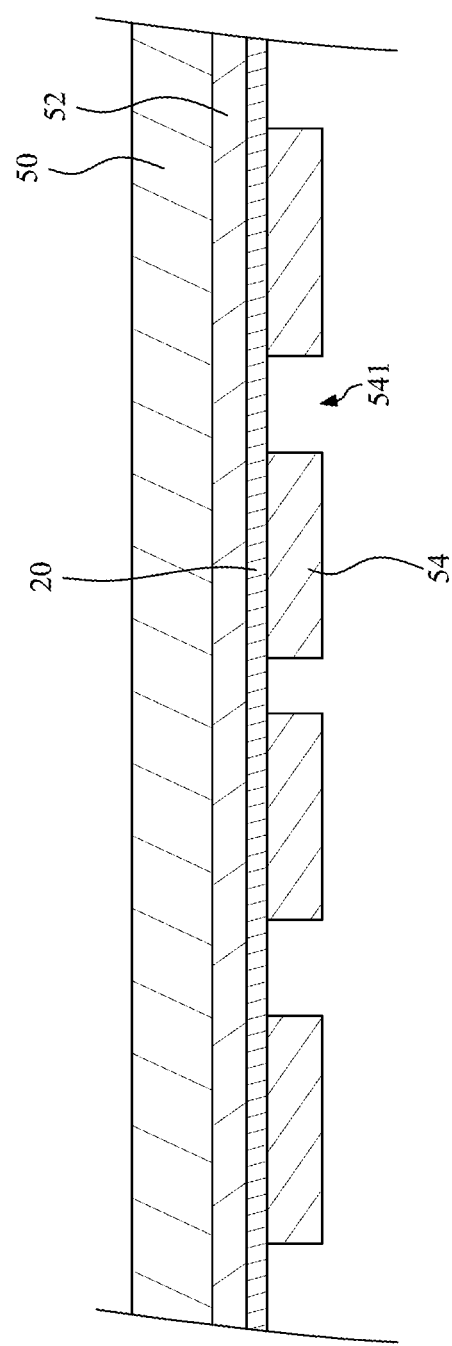
FIG. 16 illustrates one or more stages of an example of a method for manufacturing a heat dissipating device according to some embodiments of the present disclosure.

Referring to FIG. 16, the photoresist layer 54 is patterned by, for example, exposure and development to define a plurality of openings 541 to expose portions of the metal layer 20.

Figure 17:
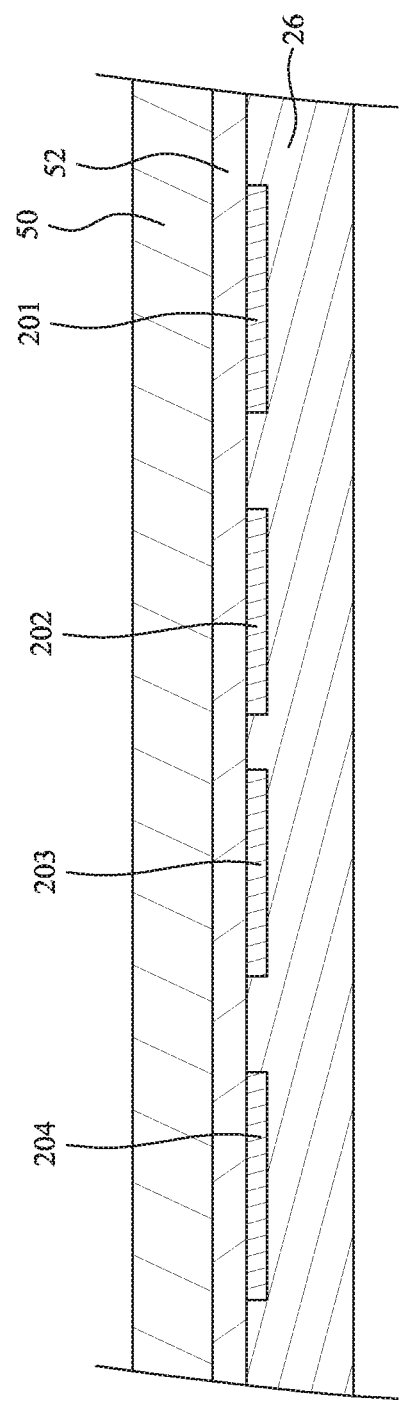
FIG. 17 illustrates one or more stages of an example of a method for manufacturing a heat dissipating device according to some embodiments of the present disclosure.

Referring to FIG. 17, the exposed portions of the metal layer 20 that are not covered by the patterned photoresist layer 54 are etched to form a plurality of dummy pads 201, 202, 203, 204. Then, the photoresist layer 54 is removed. Then, a first dielectric layer 26 is formed or disposed on the release layer 52 by, for example, coating to cover the dummy pads 201, 202, 203, 204. The first dielectric layer 26 may include, or be formed from, a photoresist layer, a cured photosensitive material, a cured photoimageable dielectric (PID) material such as an epoxy or a PI, or a combination of two or more thereof.

Figure 18:
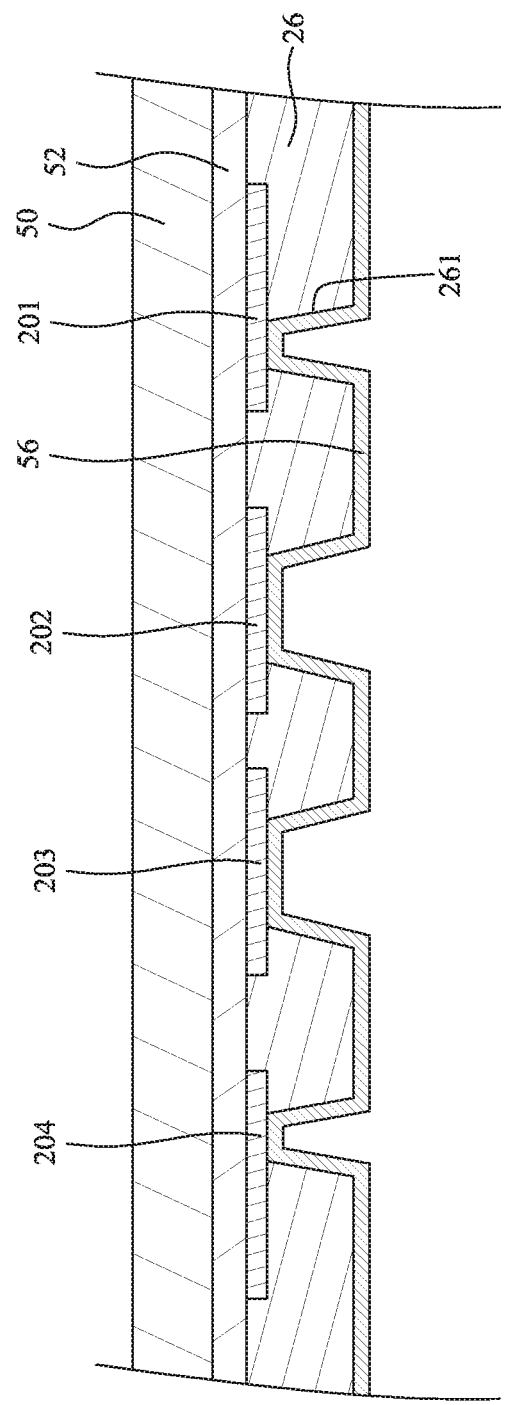
FIG. 18 illustrates one or more stages of an example of a method for manufacturing a heat dissipating device according to some embodiments of the present disclosure.

Referring to FIG. 18, the first dielectric layer 26 is patterned by, for example, exposure and development to define a plurality of openings 261 to expose portions of the dummy pads 201, 202, 203, 204. Then, a thermoelectric material 56 is formed or disposed on the first dielectric layer 26 and in the openings 261 by, for example, physical vapor deposition (PVD) to contact the dummy pads 201, 202, 203, 204. A value of "Z×T" of the thermoelectric material 56 is greater than or equal to about 0.5, about 0.8, or about 1.0.

Figure 19:
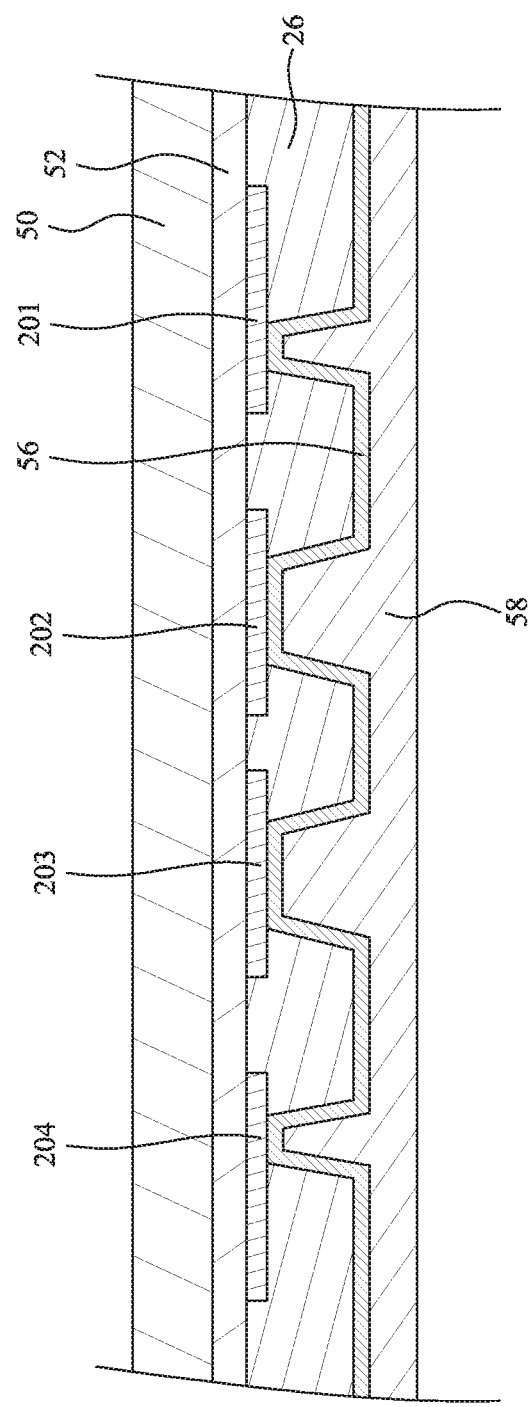
FIG. 19 illustrates one or more stages of an example of a method for manufacturing a heat dissipating device according to some embodiments of the present disclosure.

Referring to FIG. 19, a photoresist layer 58 is formed or disposed on the thermoelectric material 56 by, for example, coating.

Figure 20:
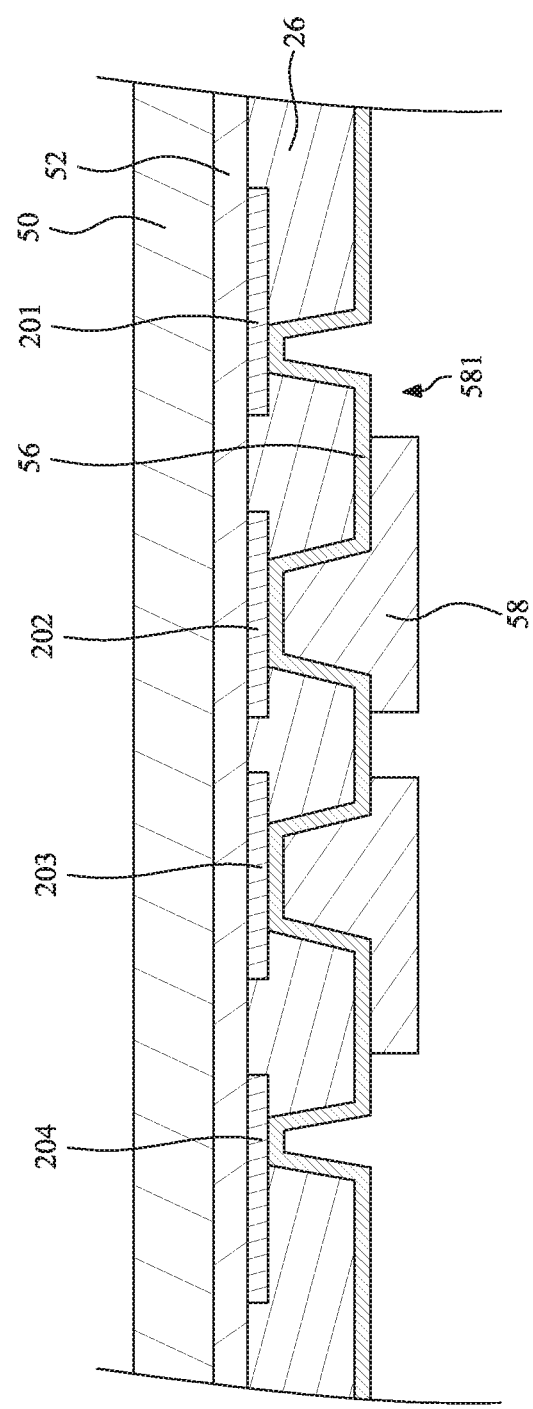
FIG. 20 illustrates one or more stages of an example of a method for manufacturing a heat dissipating device according to some embodiments of the present disclosure.

Referring to FIG. 20, the photoresist layer 58 is patterned by, for example, exposure and development to define a plurality of openings 581 to expose portions of the thermoelectric material 56.

Figure 21:
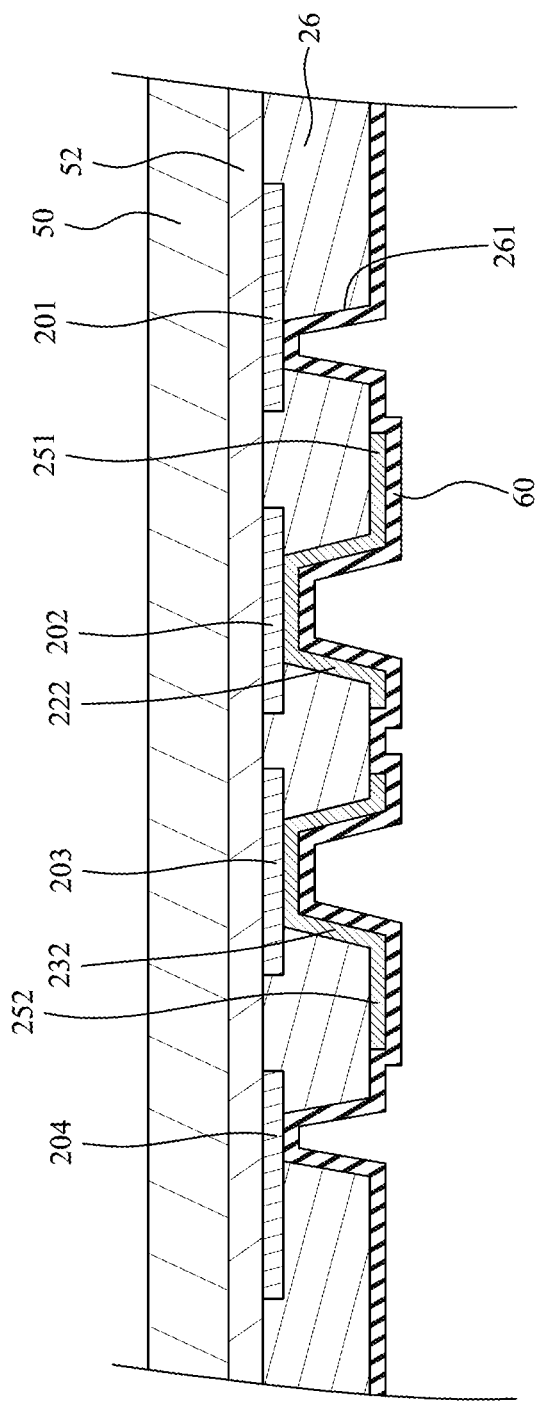
FIG. 21 illustrates one or more stages of an example of a method for manufacturing a heat dissipating device according to some embodiments of the present disclosure.

Referring to FIG. 21, the exposed portions of the thermoelectric material 56 that are not covered by the patterned photoresist layer 58 are etched to form a second upper periphery conductor 222, a circuit layer 251, a third upper periphery conductor 232 and a circuit layer 252. Then, the photoresist layer 58 is removed. Then, an isolation layer 60 is formed or disposed on the first dielectric layer 26 and in the openings 261 to cover the second upper periphery conductor 222, the circuit layer 251, the third upper periphery conductor 232 and the circuit layer 252.

Figure 22:
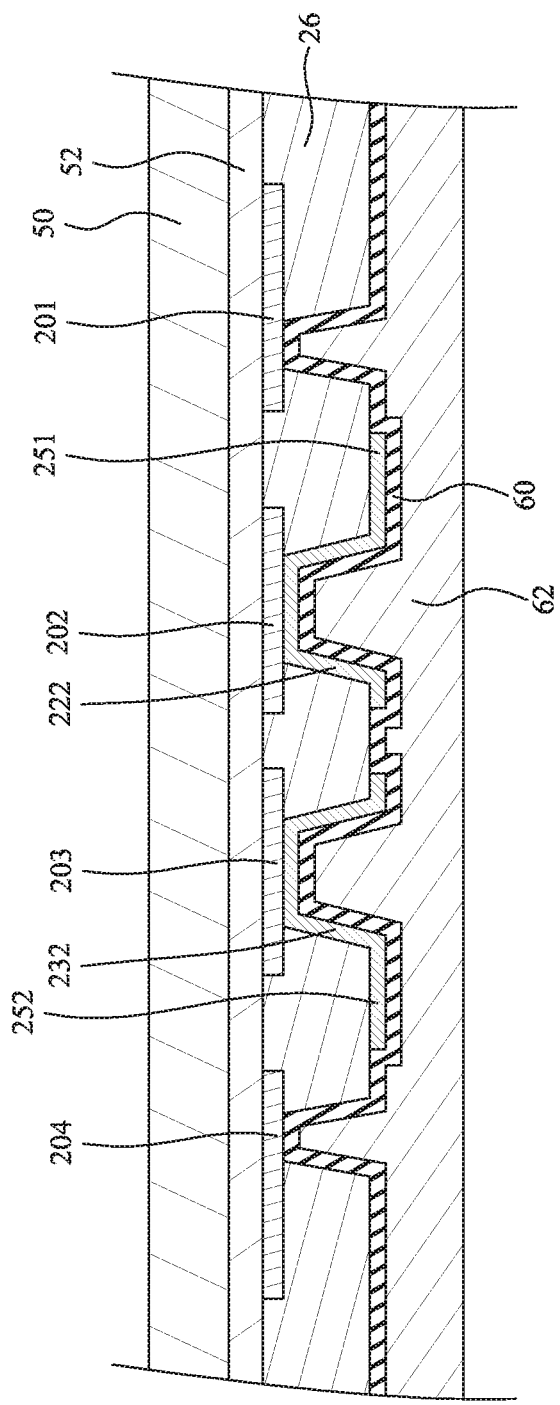
FIG. 22 illustrates one or more stages of an example of a method for manufacturing a heat dissipating device according to some embodiments of the present disclosure.

Referring to FIG. 22, a photoresist layer 62 is formed or disposed on the isolation layer 60 by, for example, coating.

Figure 23:
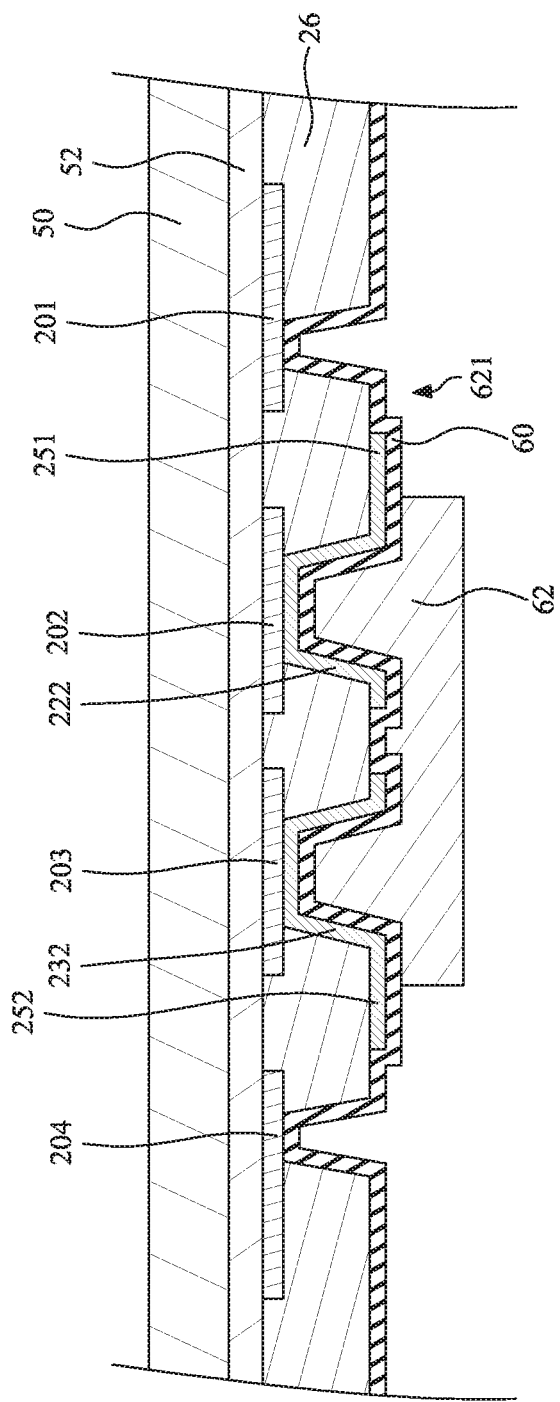
FIG. 23 illustrates one or more stages of an example of a method for manufacturing a heat dissipating device according to some embodiments of the present disclosure.

Referring to FIG. 23, the photoresist layer 62 is patterned by, for example, exposure and development to define a plurality of openings 621 to expose portions of the isolation layer 60.

Figure 24:
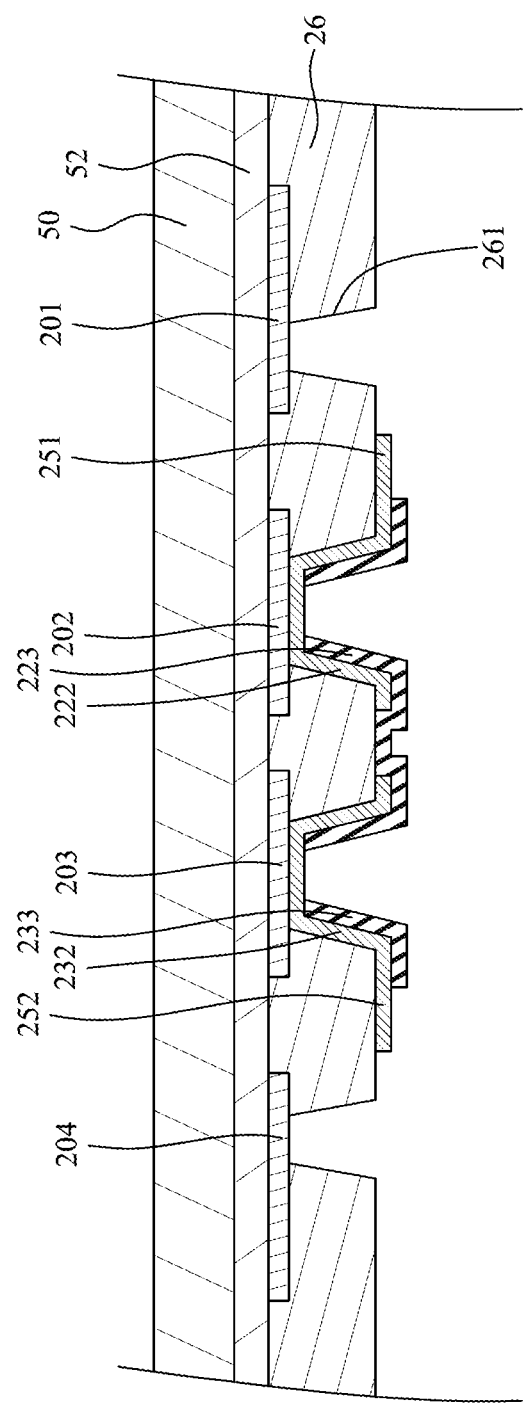
FIG. 24 illustrates one or more stages of an example of a method for manufacturing a heat dissipating device according to some embodiments of the present disclosure.

Referring to FIG. 24, the exposed portions of the isolation layer 60 that are not covered by the patterned photoresist layer 62 are etched to form a second upper isolation material 223 and a third upper isolation material 233. The second upper isolation material 223 is disposed on the second upper periphery conductor 222, and the third upper isolation material 233 is disposed on the third upper periphery conductor 232. Then, the photoresist layer 62 is removed.

Figure 25:
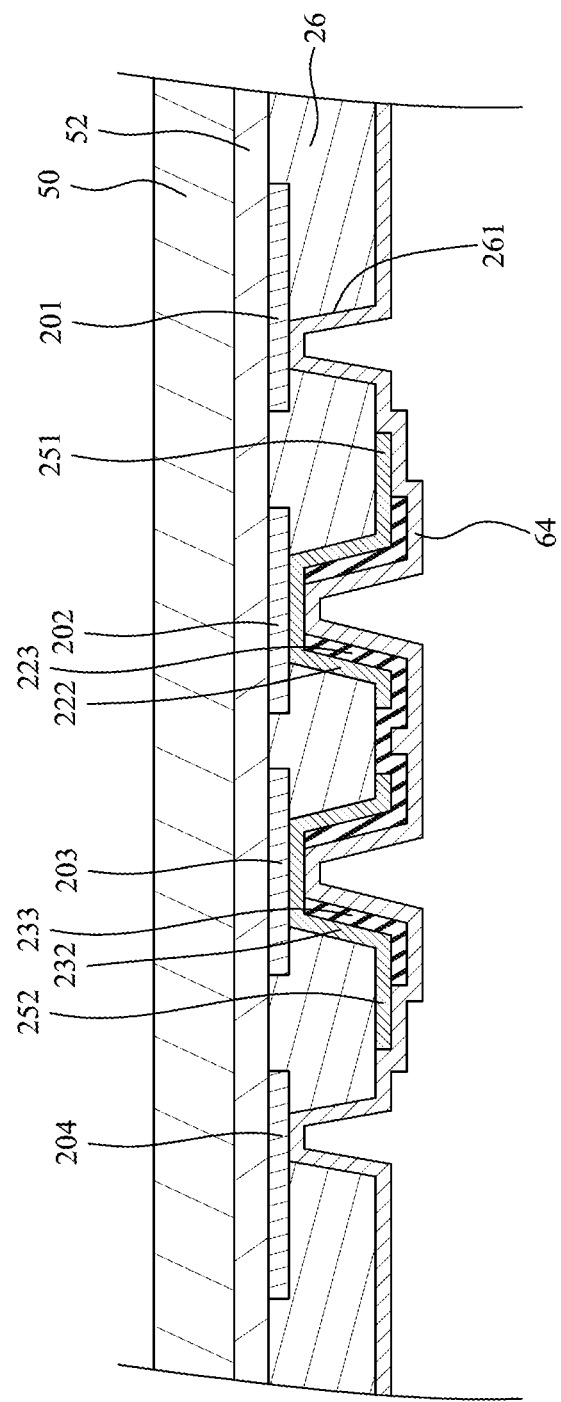
FIG. 25 illustrates one or more stages of an example of a method for manufacturing a heat dissipating device according to some embodiments of the present disclosure.

Referring to FIG. 25, a thermoelectric material 64 is formed or disposed on the first dielectric layer 26 to cover the second upper isolation material 223 and the third upper isolation material 233 by, for example, physical vapor deposition (PVD). A portion of the thermoelectric material 64 is formed or disposed in the openings 261. A value of "Z×T" of the thermoelectric material 64 is greater than or equal to about 0.5, about 0.8, or about 1.0.

Figure 26:
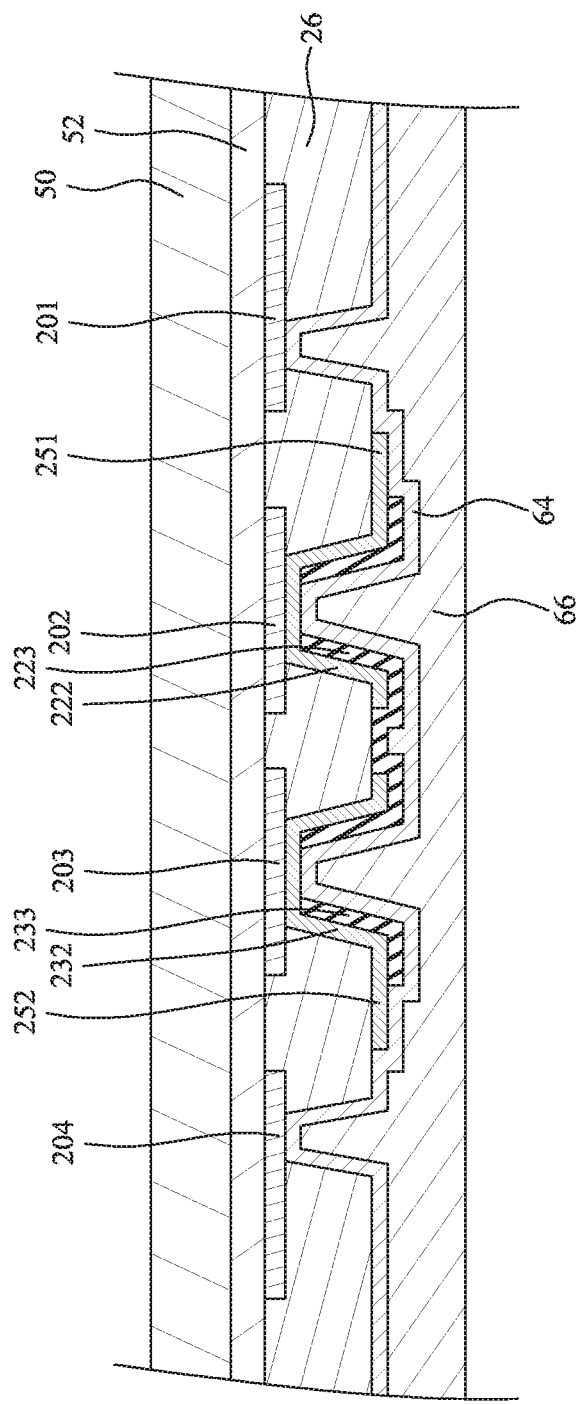
FIG. 26 illustrates one or more stages of an example of a method for manufacturing a heat dissipating device according to some embodiments of the present disclosure.

Referring to FIG. 26, a photoresist layer 66 is formed or disposed on the thermoelectric material 64 by, for example, coating.

Figure 27:
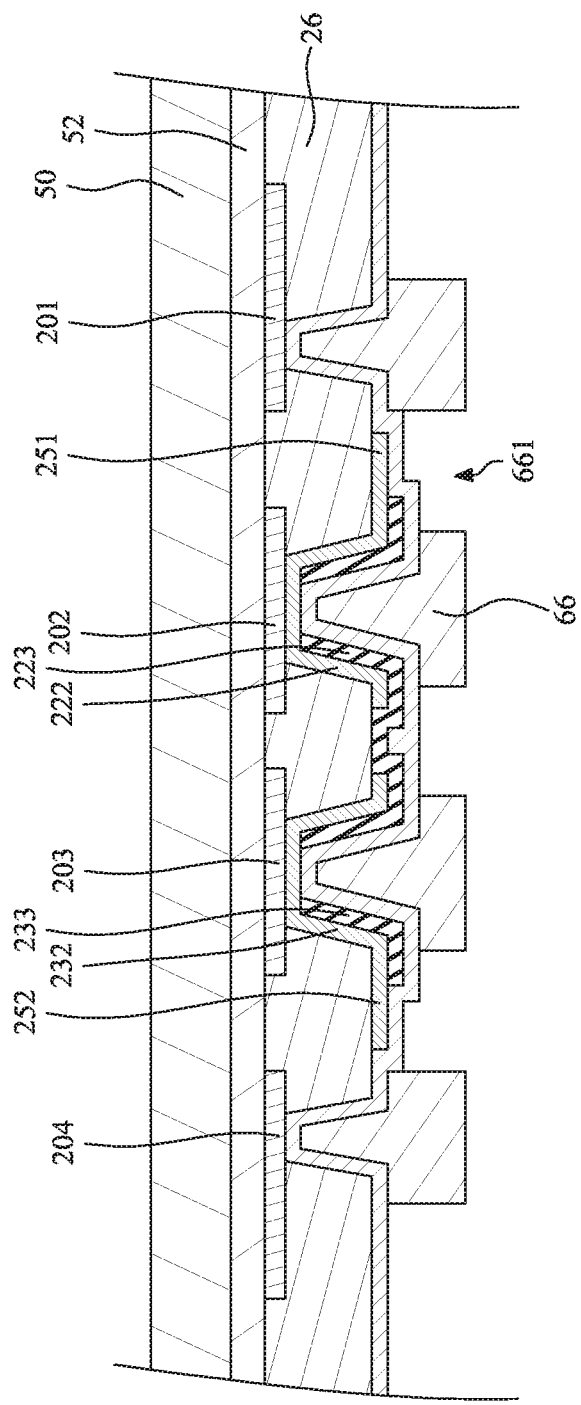
FIG. 27 illustrates one or more stages of an example of a method for manufacturing a heat dissipating device according to some embodiments of the present disclosure.

Referring to FIG. 27, the photoresist layer 66 is patterned by, for example, exposure and development to define a plurality of openings 661 to expose portions of the thermoelectric material 64.

Figure 28:
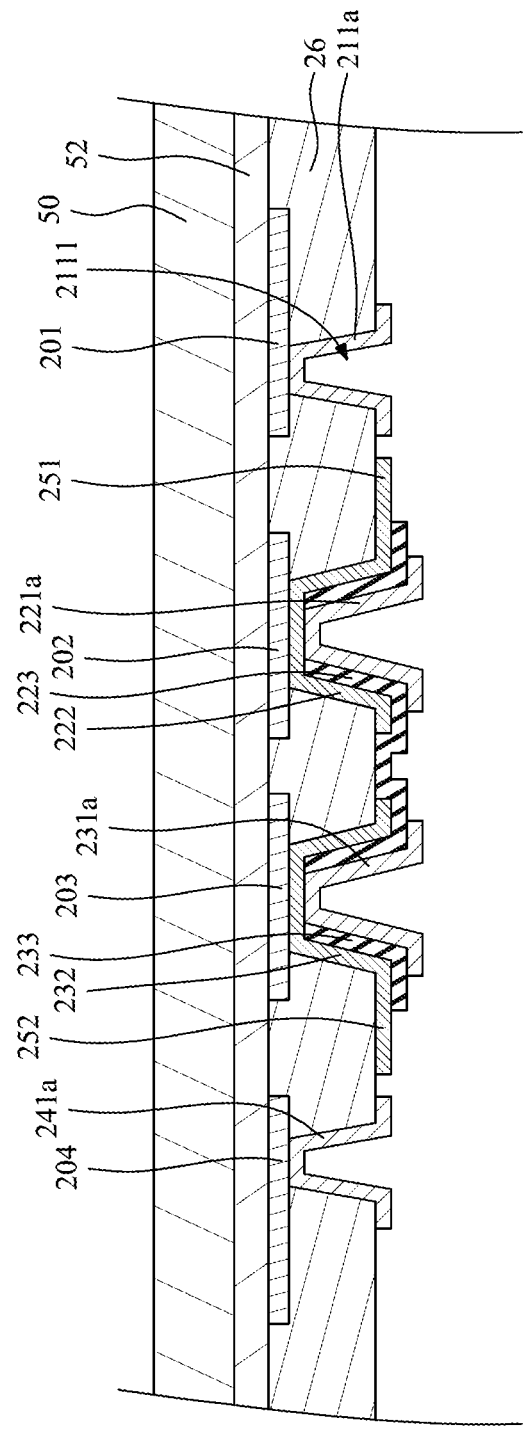
FIG. 28 illustrates one or more stages of an example of a method for manufacturing a heat dissipating device according to some embodiments of the present disclosure.

Referring to FIG. 28, the exposed portions of the thermoelectric material 64 that are not covered by the patterned photoresist layer 66 are etched to form an upper portion 211a, an upper portion 221a, an upper portion 231a and an upper portion 241a. The upper portion 211a and the upper portion 241a are disposed in the openings 261, and each defines a central hole (e.g., a central hole 2111). The upper portion 221a is disposed on the second upper isolation material 223, and defines a central hole. The upper portion 231a is disposed on the third upper isolation material 233, and defines a central hole. Then, the photoresist layer 66 is removed.

Figure 29:
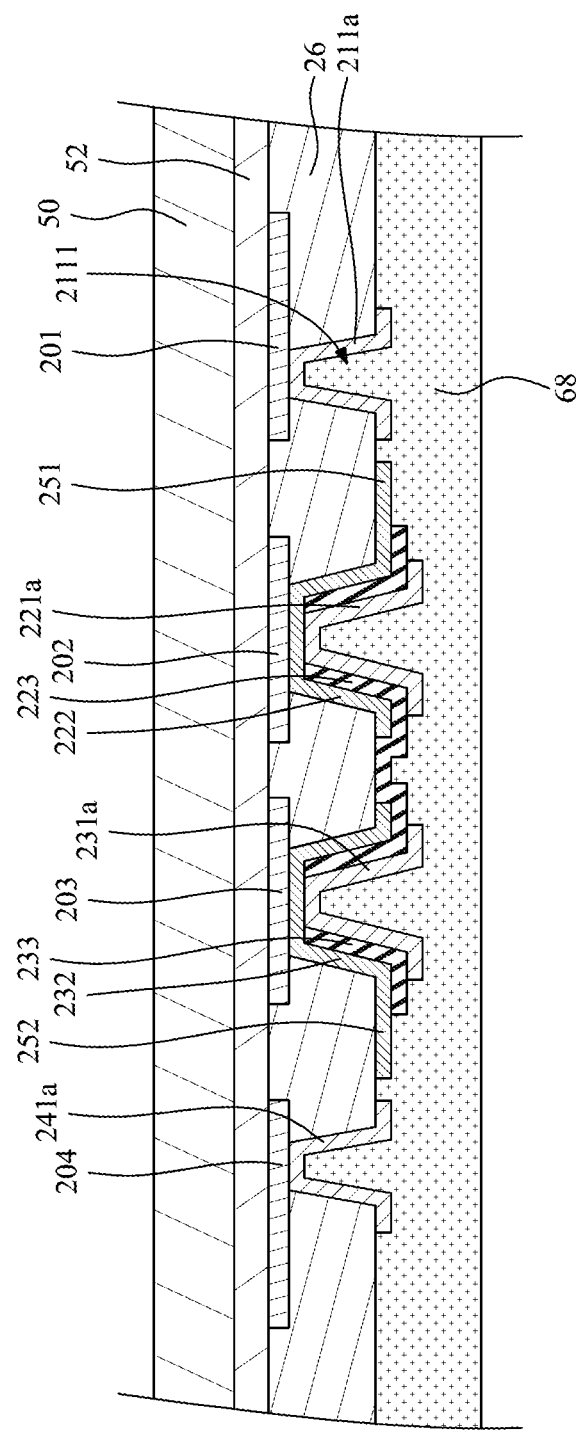
FIG. 29 illustrates one or more stages of an example of a method for manufacturing heat dissipating device according to some embodiments of the present disclosure.

Referring to FIG. 29, an isolation layer 68 is formed or disposed on the first dielectric layer 26 by, for example, coating to cover the upper portions 211a, 221a, 231a, 241a.

Figure 30:
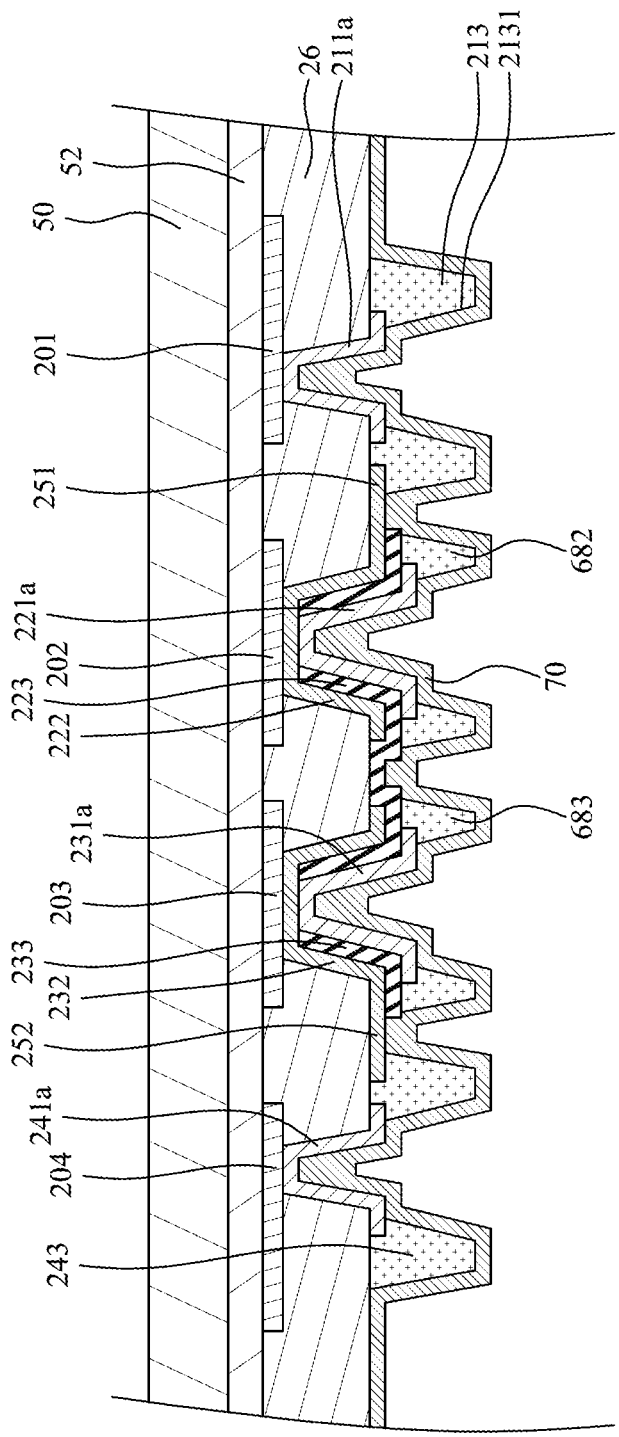
FIG. 30 illustrates one or more stages of an example of a method for manufacturing a heat dissipating device according to some embodiments of the present disclosure.

Referring to FIG. 30, the isolation layer 68 is patterned by, for example, exposure and development to form a first upper isolation material 213, a second supporting isolation material 682, a third supporting isolation material 683 and a fourth upper isolation material 243. The first upper isolation material 213 defines a through hole 2131 to expose the central hole 2111 defined by the upper portion 211a. The second supporting isolation material 682 defines a through hole to expose the central hole defined by the upper portion 221a. The third supporting isolation material 683 defines a through hole to expose the central hole defined by the upper portion 231a. The fourth upper isolation material 243 defines a through hole to expose the central hole defined by the upper portion 241a. Then, a thermoelectric material 70 is formed or disposed on the first upper isolation material 213, the second supporting isolation material 682, the third supporting isolation material 683 and the fourth upper isolation material 243, and in the central hole 2111 defined by the upper portion 211a, the central hole defined by the upper portion 221a, the central hole defined by the upper portion 231a and the central hole defined by the upper portion 241a. The thermoelectric material 70 may be the same as the thermoelectric material 56.

Figure 31:
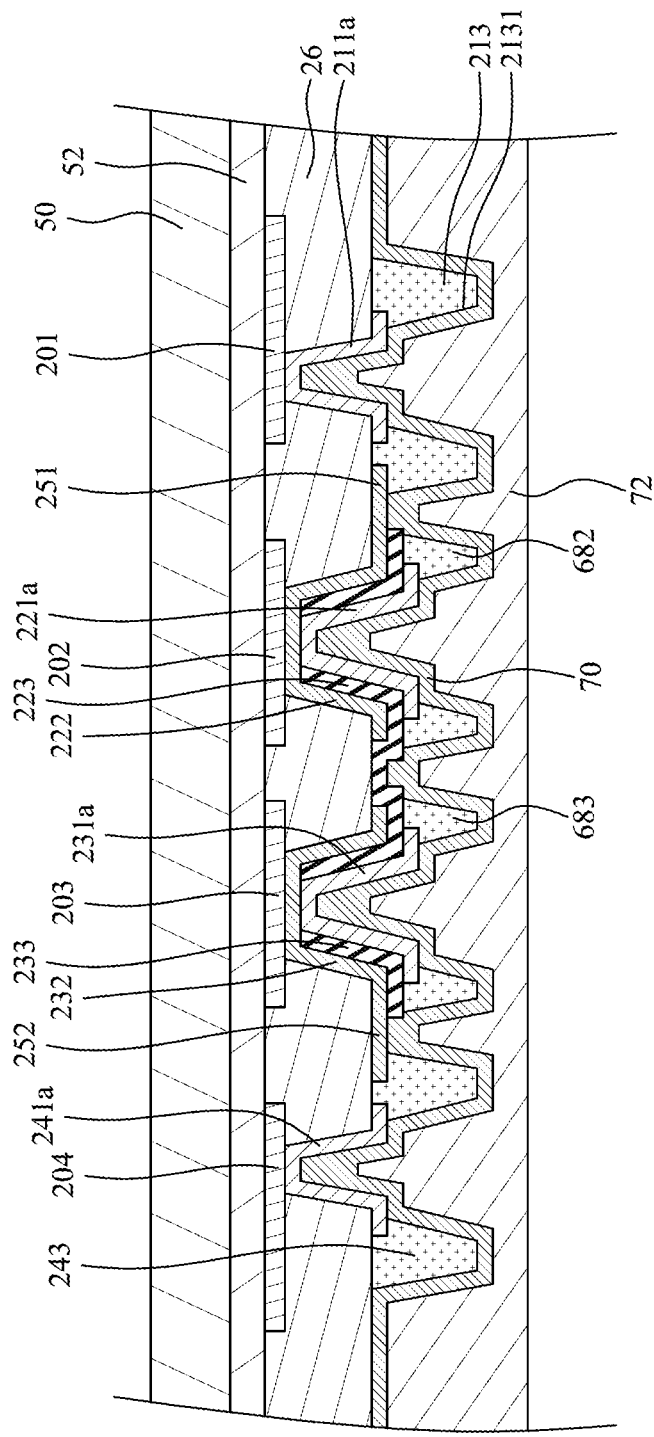
FIG. 31 illustrates one or more stages of an example of a method for manufacturing a heat dissipating device according to some embodiments of the present disclosure.

Referring to FIG. 31, a photoresist layer 72 is formed or disposed on the thermoelectric material 70 by, for example, coating.

Figure 32:
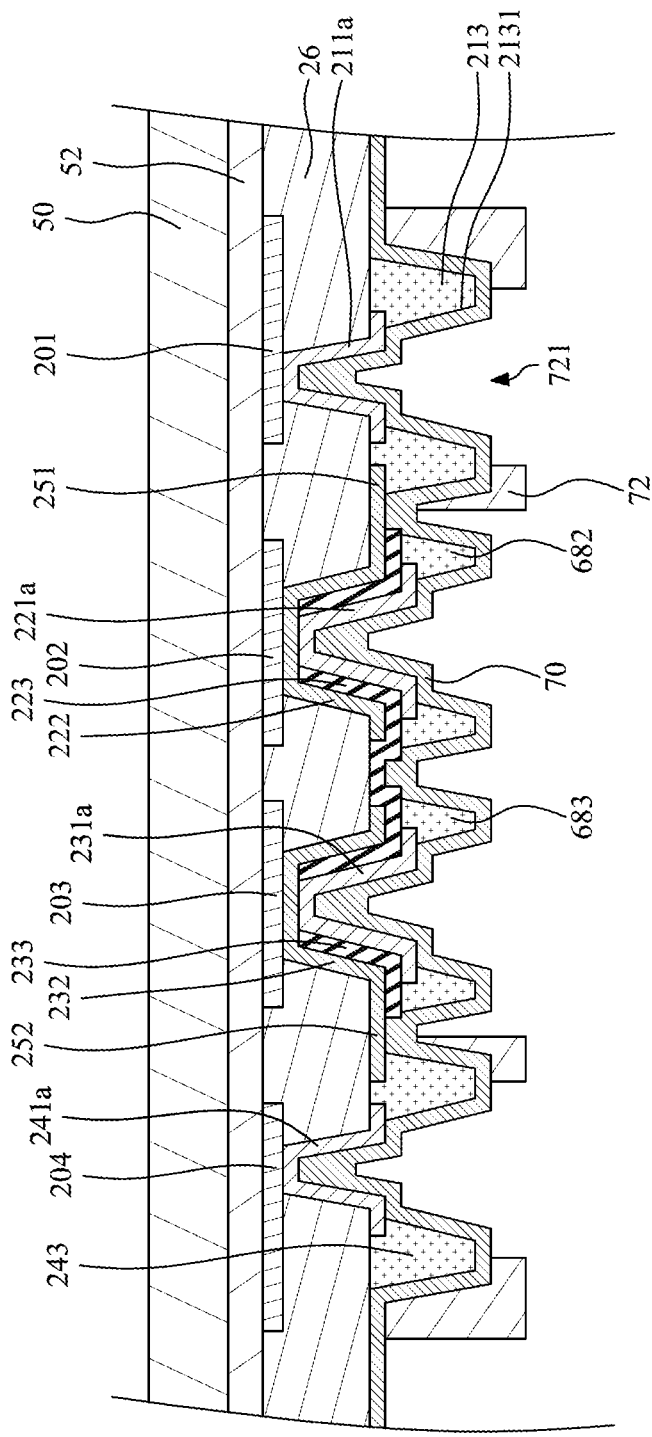
FIG. 32 illustrates one or more stages of an example of a method for manufacturing a heat dissipating device according to some embodiments of the present disclosure.

Referring to FIG. 32, the photoresist layer 72 is patterned by, for example, exposure and development to define a plurality of openings 721 to expose portions of the thermoelectric material 70.

Figure 33:
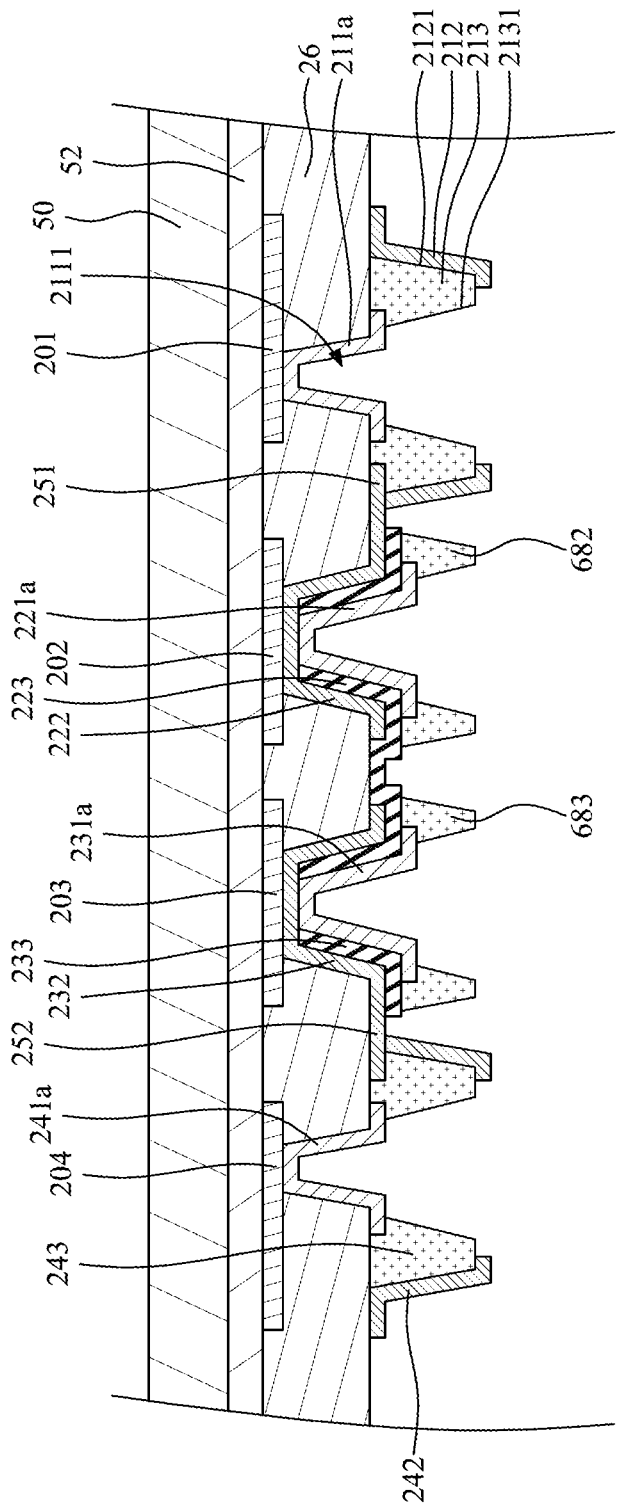
FIG. 33 illustrates one or more stages of an example of a method for manufacturing a heat dissipating device according to some embodiments of the present disclosure.

Referring to FIG. 33, the exposed portions of the thermoelectric material 70 that are not covered by the patterned photoresist layer 72 are etched to form a first upper periphery conductor 212 and a fourth upper periphery conductor 242. Then, the photoresist layer 72 is removed.

Figure 34:
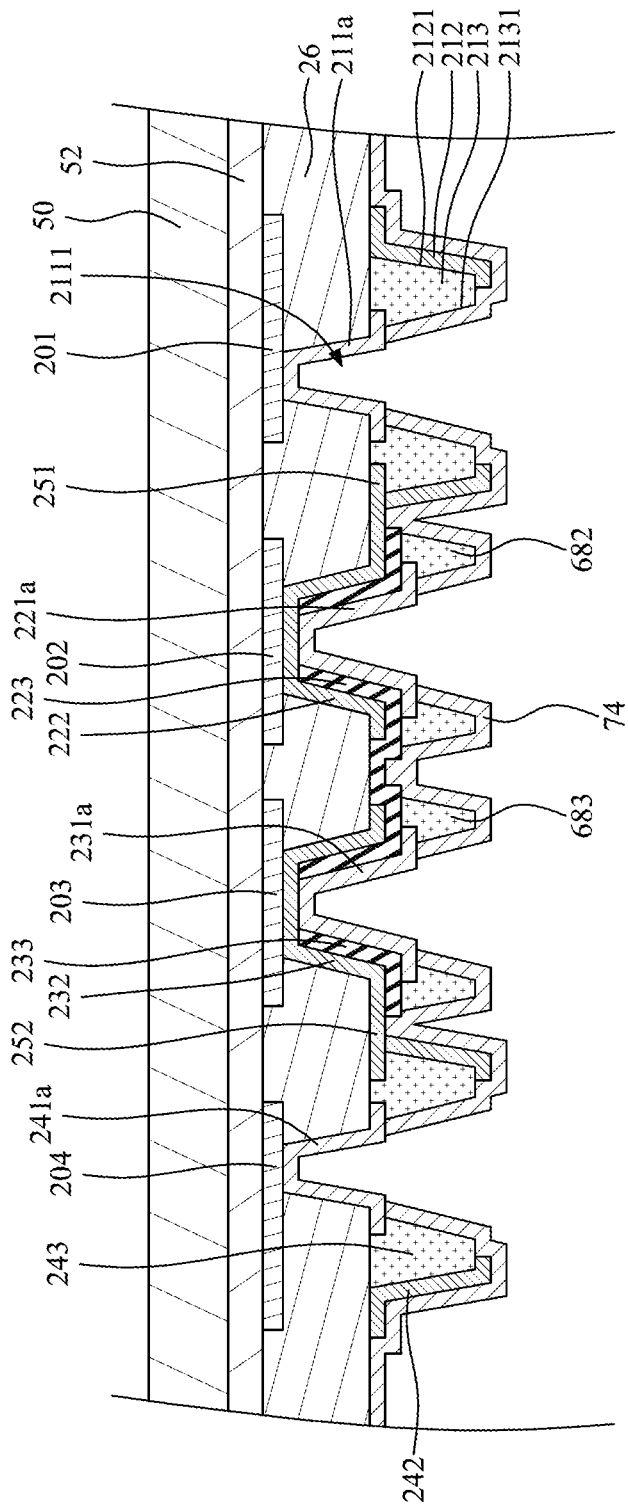
FIG. 34 illustrates one or more stages of an example of a method for manufacturing a heat dissipating device according to some embodiments of the present disclosure.

Referring to FIG. 34, a thermoelectric material 74 is formed or disposed on the first upper periphery conductor 212, the first upper isolation material 213, the second supporting isolation material 682, the third supporting isolation material 683, the fourth upper isolation material 243 and the fourth upper periphery conductor 242. The thermoelectric material 74 may be the same as the thermoelectric material 64.

Figure 35:
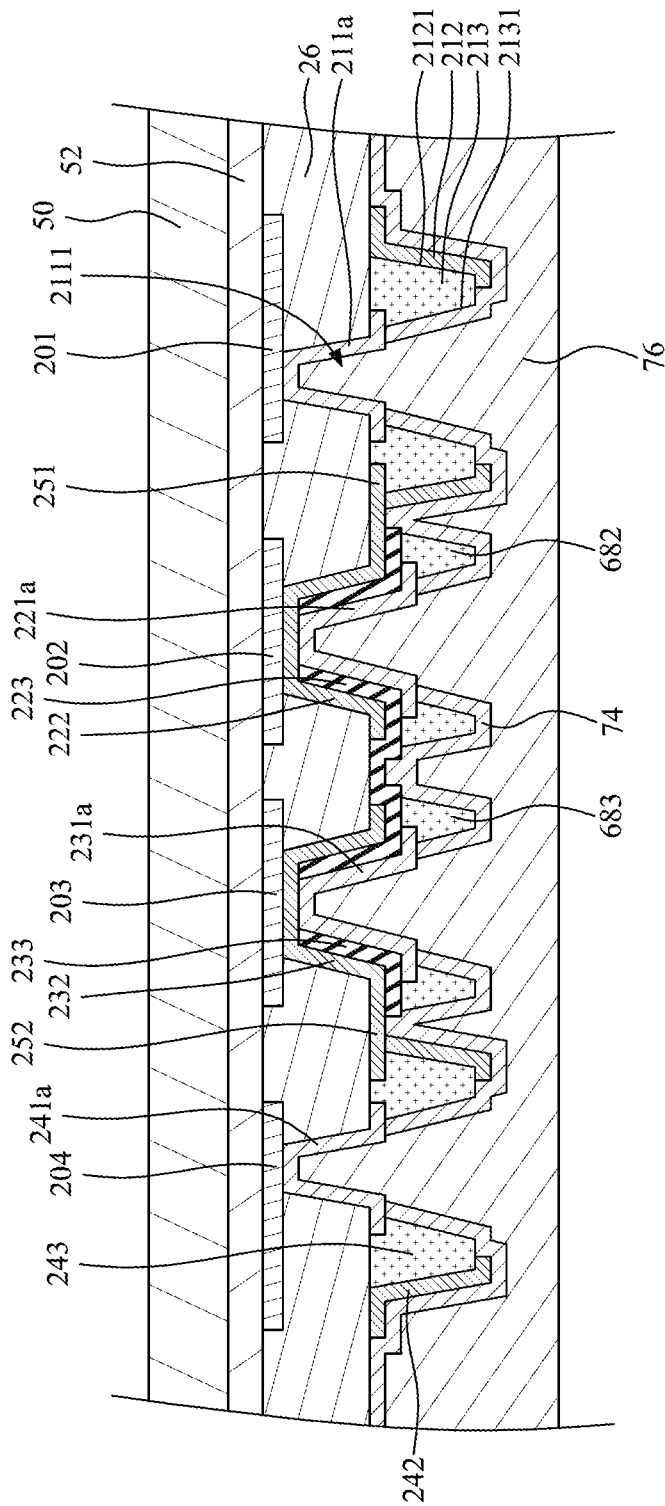
FIG. 35 illustrates one or more stages of an example of a method for manufacturing a heat dissipating device according to some embodiments of the present disclosure.

Referring to FIG. 35, a photoresist layer 76 is formed or disposed on the thermoelectric material 74 by, for example, coating.

Figure 36:
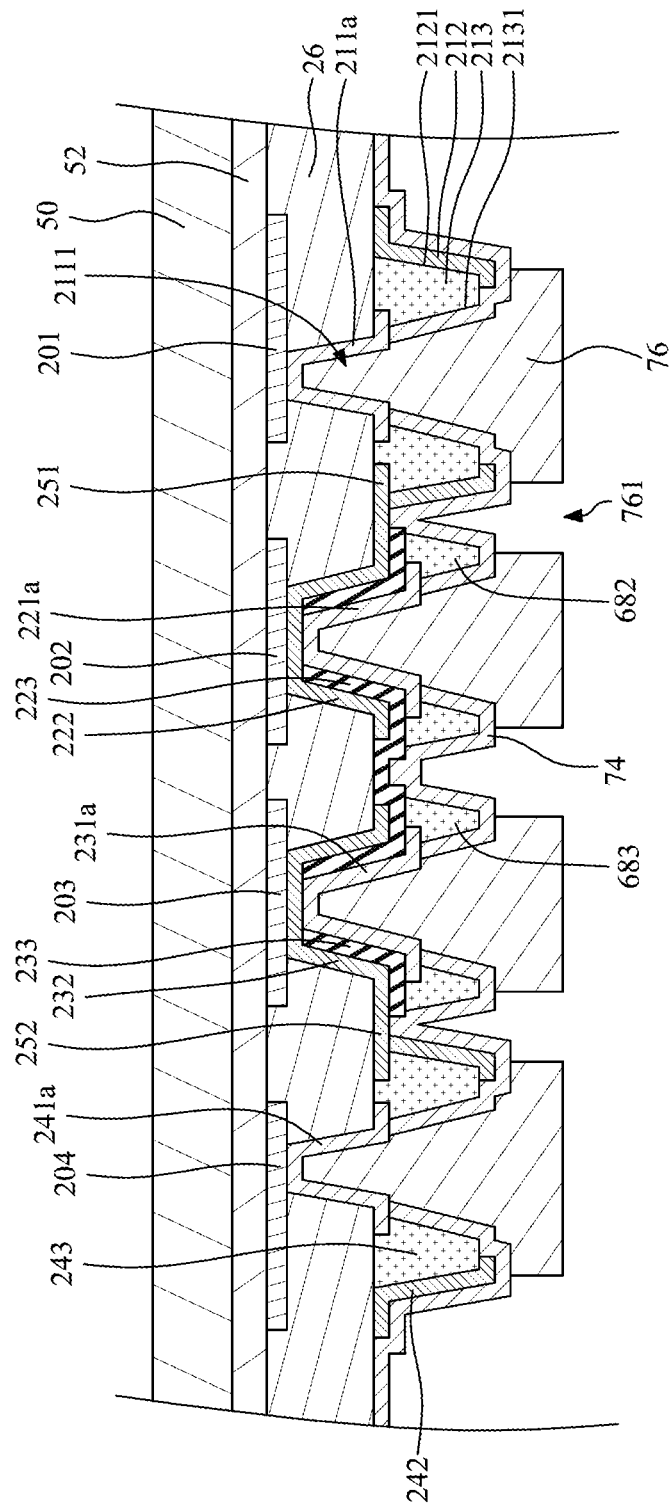
FIG. 36 illustrates one or more stages of an example of a method for manufacturing a heat dissipating device according to some embodiments of the present disclosure.

Referring to FIG. 36, the photoresist layer 76 is patterned by, for example, exposure and development to define a plurality of openings 761 to expose portions of the thermoelectric material 74.

Figure 37:
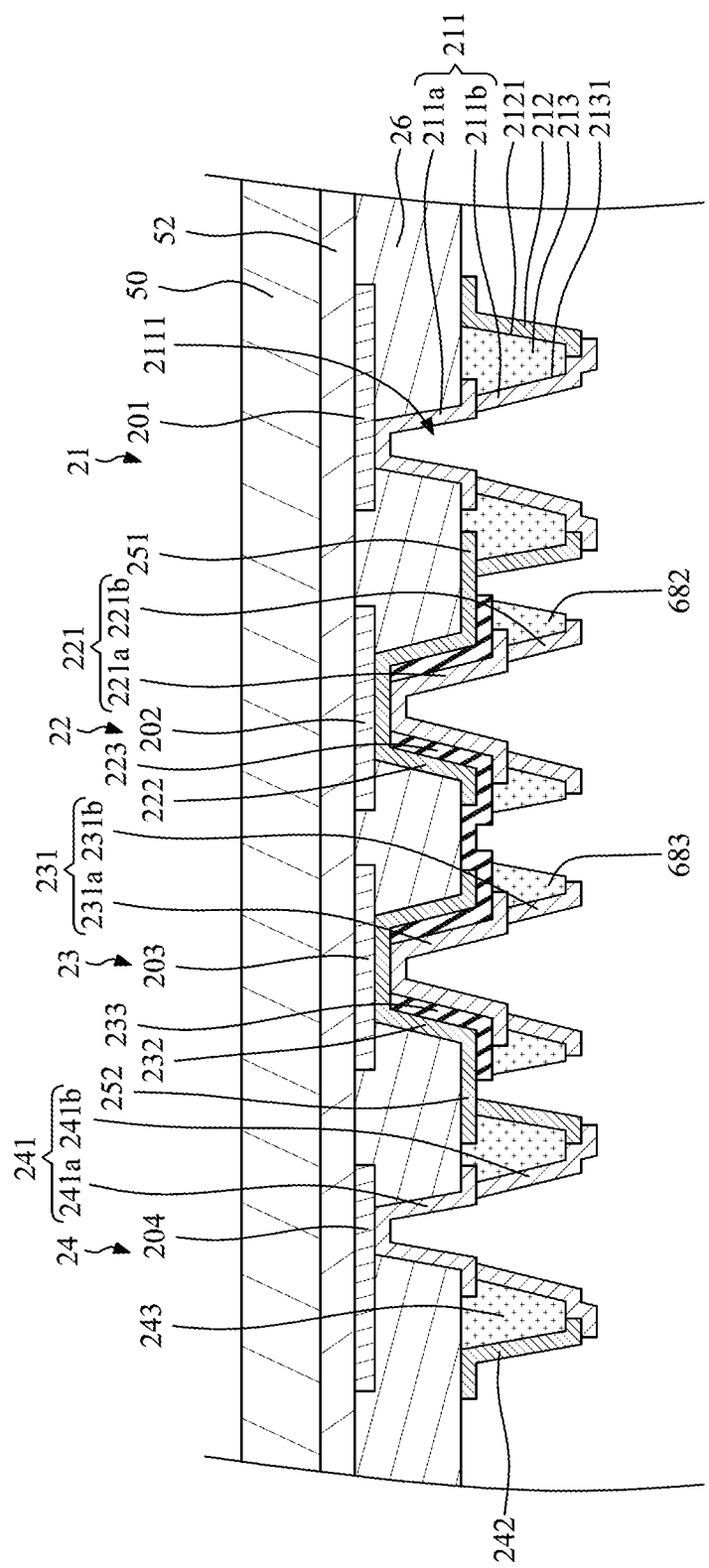
FIG. 37 illustrates one or more stages of an example of a method for manufacturing a heat dissipating device according to some embodiments of the present disclosure.

Referring to FIG. 37, the exposed portions of the thermoelectric material 74 that are not covered by the patterned photoresist layer 76 are etched to form a lower portion 211b, a lower portion 221b, a lower portion 231b and a lower portion 241b. Then, the photoresist layer 76 is removed. Meanwhile, the upper portion 211a and the lower portion 211b form a first upper conductive via 211, the upper portion 221a and the lower portion 221b form a second upper conductive via 221, the upper portion 231a and the lower portion 231b form a third upper conductive via 231, and the upper portion 241a and the lower portion 241b form a fourth upper conductive via 241.

In addition, the first upper conductive via 211, the first upper periphery conductor 212 and the first upper isolation material 213 form a first upper thermal conduction unit 21. The second upper conductive via 221, the second upper periphery conductor 222 and the second upper isolation material 223 form a second upper thermal conduction unit 22. The third upper conductive via 231, the third upper periphery conductor 232 and the third upper isolation material 233 form a third upper thermal conduction unit 23. The fourth upper conductive via 241, the fourth upper periphery conductor 242 and the fourth upper isolation material 243 form a fourth upper thermal conduction unit 24.

Figure 38:
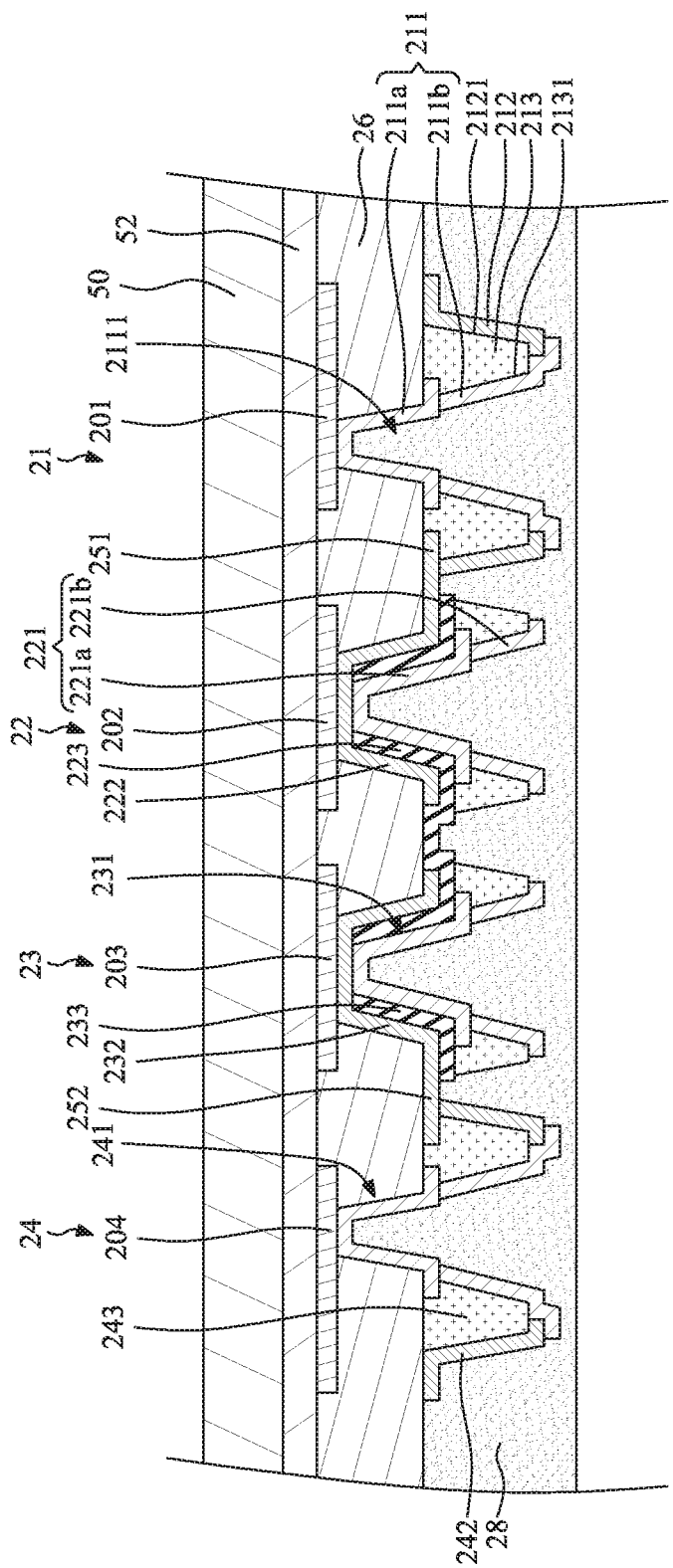
FIG. 38 illustrates one or more stages of an example of a method for manufacturing a heat dissipating device according to some embodiments of the present disclosure.

Referring to FIG. 38, a second dielectric layer 28 is formed or disposed on the first dielectric layer 26 to cover the first upper conductive via 211, the first upper periphery conductor 212, the second upper conductive via 221, the second supporting isolation material 682, the third upper conductive via 231, the third supporting isolation material 683, the fourth upper conductive via 241 and the fourth upper periphery conductor 242.

Figure 39:
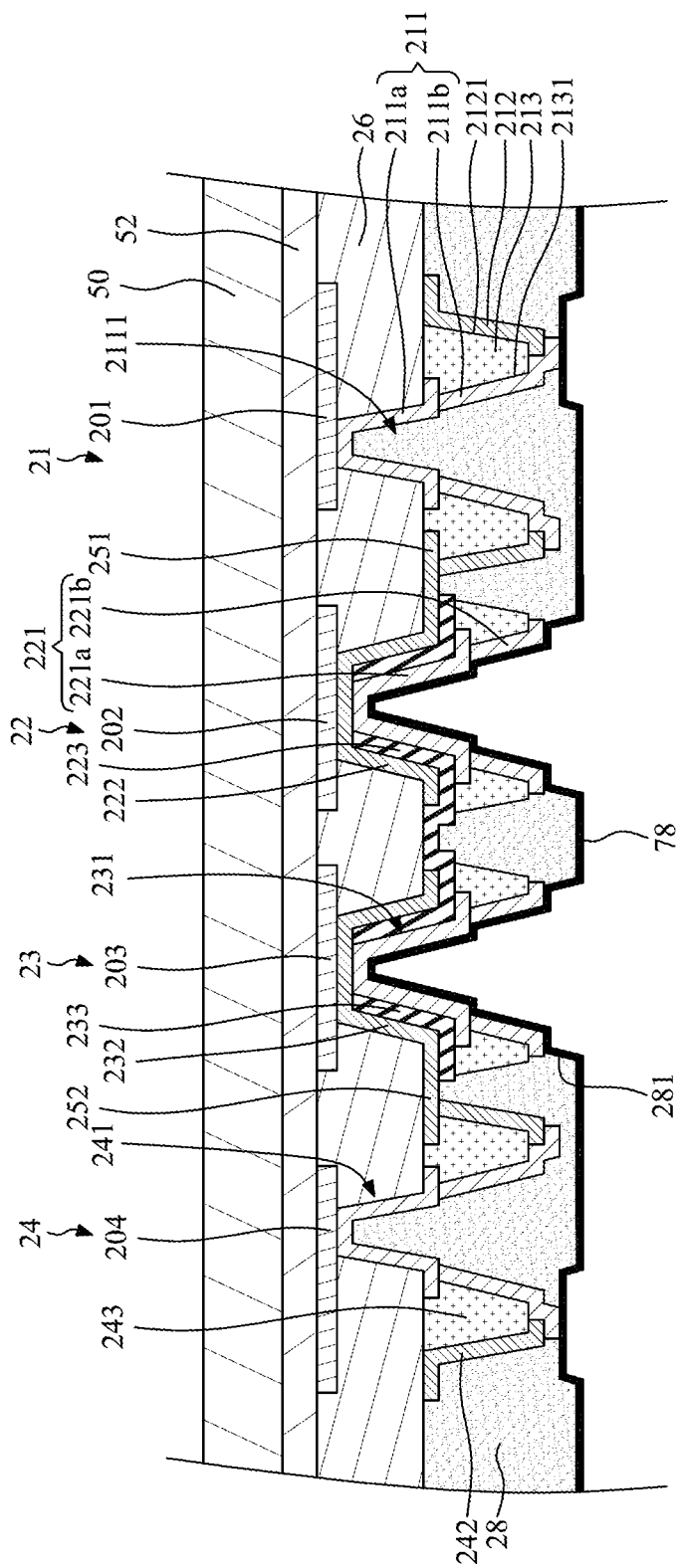
FIG. 39 illustrates one or more stages of an example of a method for manufacturing a heat dissipating device according to some embodiments of the present disclosure.

Referring to FIG. 39, the second dielectric layer 28 is patterned to form a plurality of openings 281 to expose a bottom portion of the first upper conductive via 211, the central hole defined by the second upper conductive via 221, the central hole defined by the third upper conductive via 231 and a bottom portion of the fourth upper conductive via 241. Then, a seed layer 78 is formed on the second dielectric layer 28 and in the openings 281 by, for example, physical vapor deposition (PVD).

Figure 40:
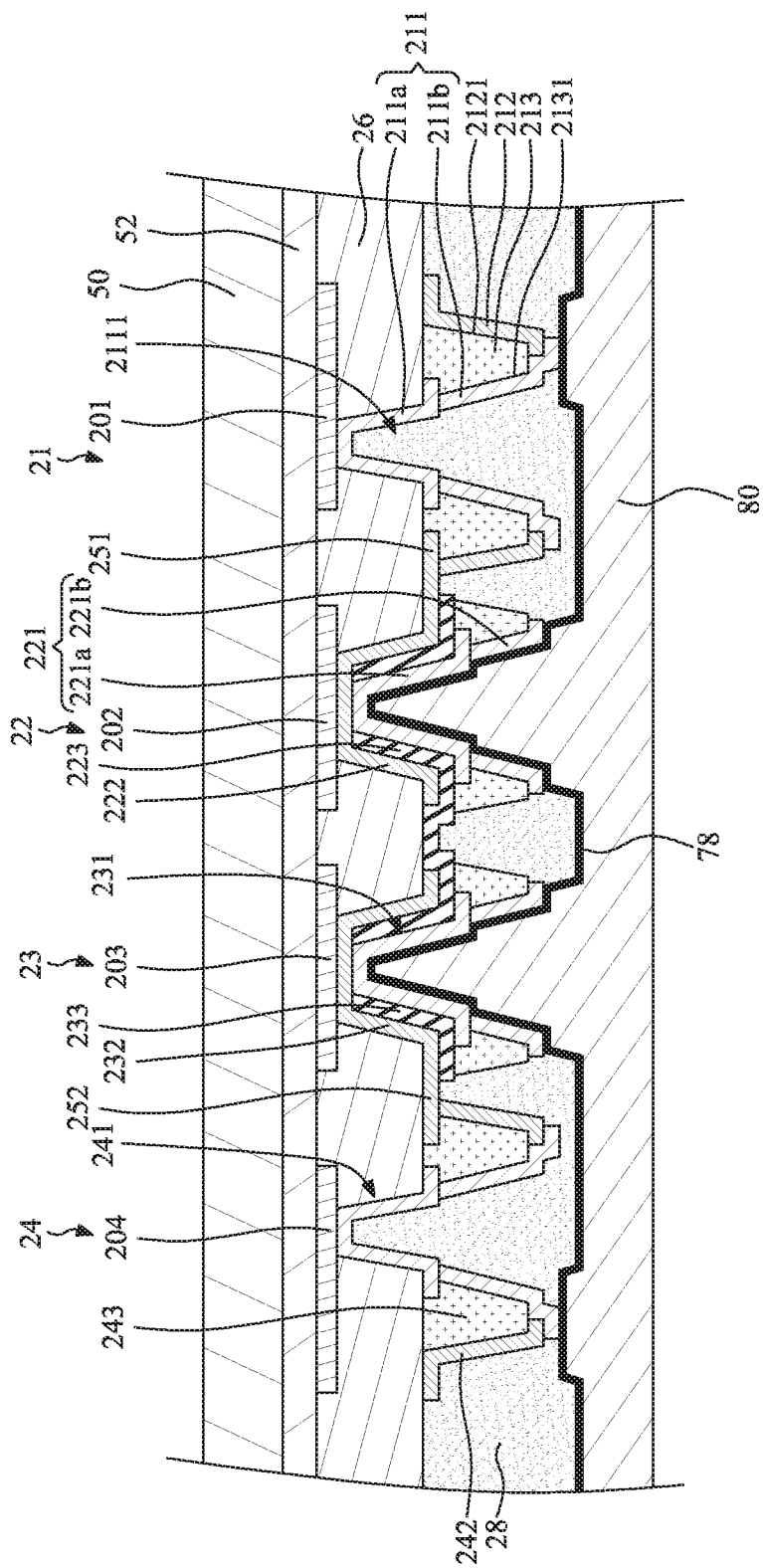
FIG. 40 illustrates one or more stages of an example of a method for manufacturing heat dissipating device according to some embodiments of the present disclosure.

Referring to FIG. 40, a photoresist layer 80 is formed or disposed on the seed layer 78 by, for example, coating.

Figure 41:
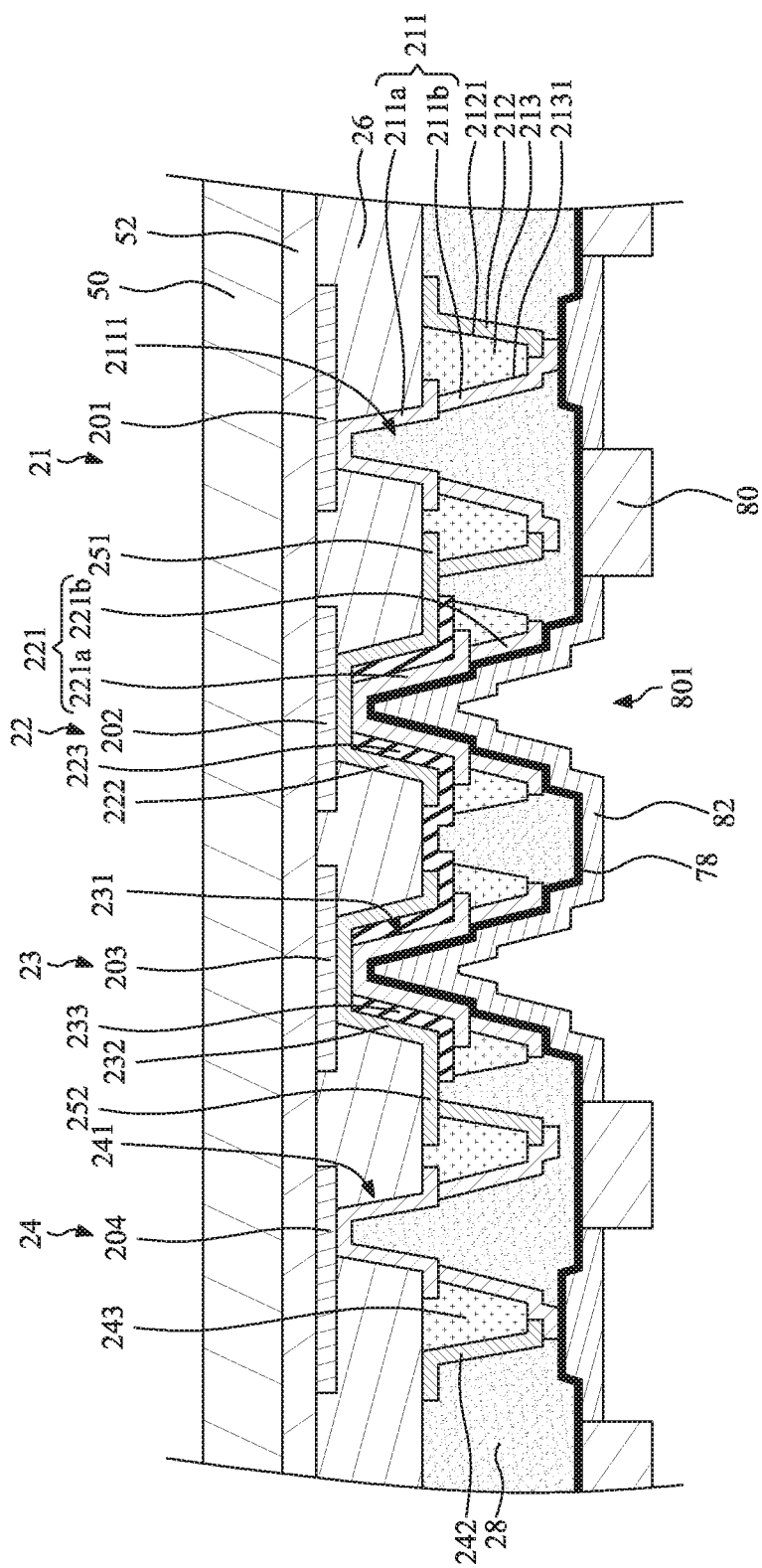
FIG. 41 illustrates one or more stages of an example of a method for manufacturing a heat dissipating device according to some embodiments of the present disclosure.

Referring to FIG. 41, the photoresist layer 80 is patterned by, for example, exposure and development to define a plurality of openings 801 to expose portions of the seed layer 78. Then, a conductive layer 82 (e.g., copper layer) is formed or disposed on the seed layer 78 in the openings 801 of the photoresist layer 80.

Figure 42:
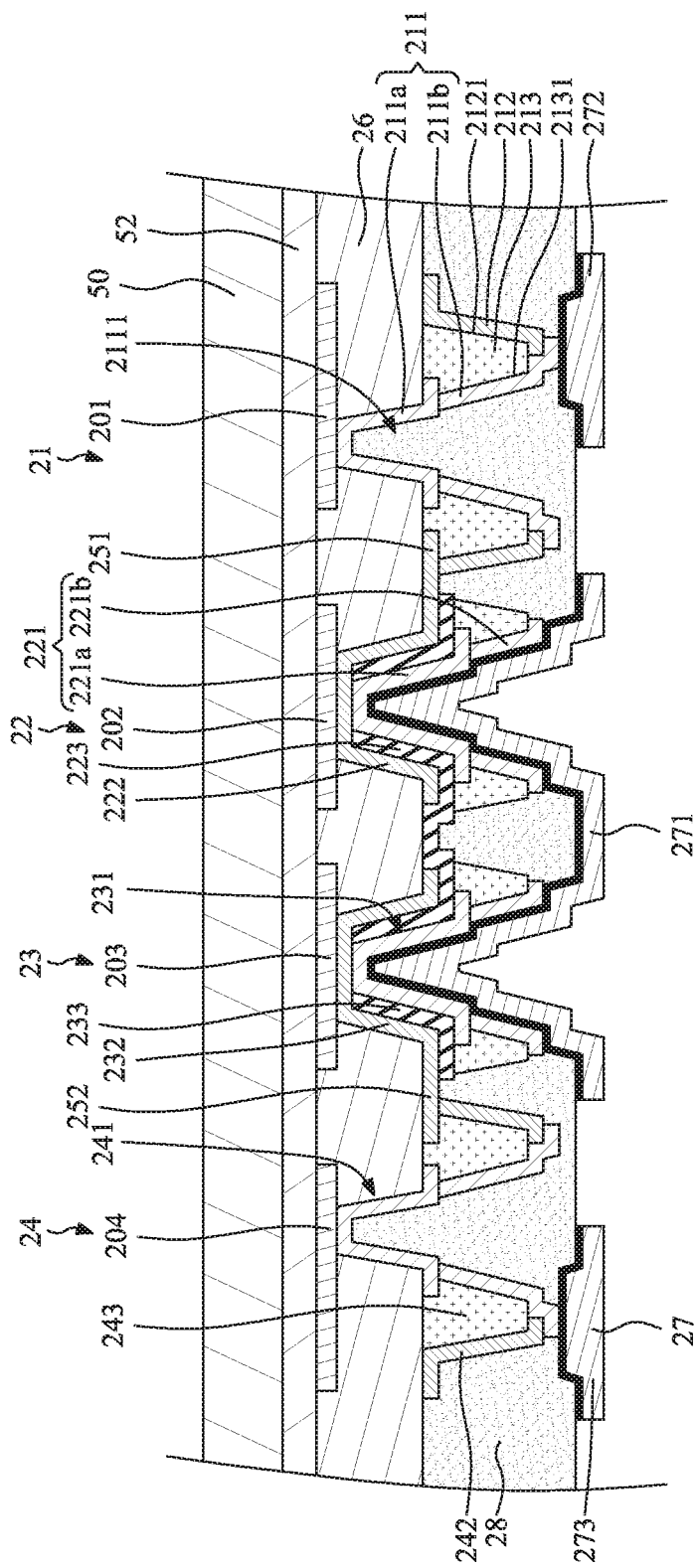
FIG. 42 illustrates one or more stages of an example of a method for manufacturing a heat dissipating device according to some embodiments of the present disclosure.

Referring to FIG. 42, the photoresist layer 80 is removed. Then, portions of the seed layer 78 that are not covered by the conductive layer 82 are etched so as to form an upper patterned circuit layer 27. In some embodiments, the upper patterned circuit layer 27 includes a first pad portion 271, a second pad portion 272 and a third pad portion 273.

Figure 43:
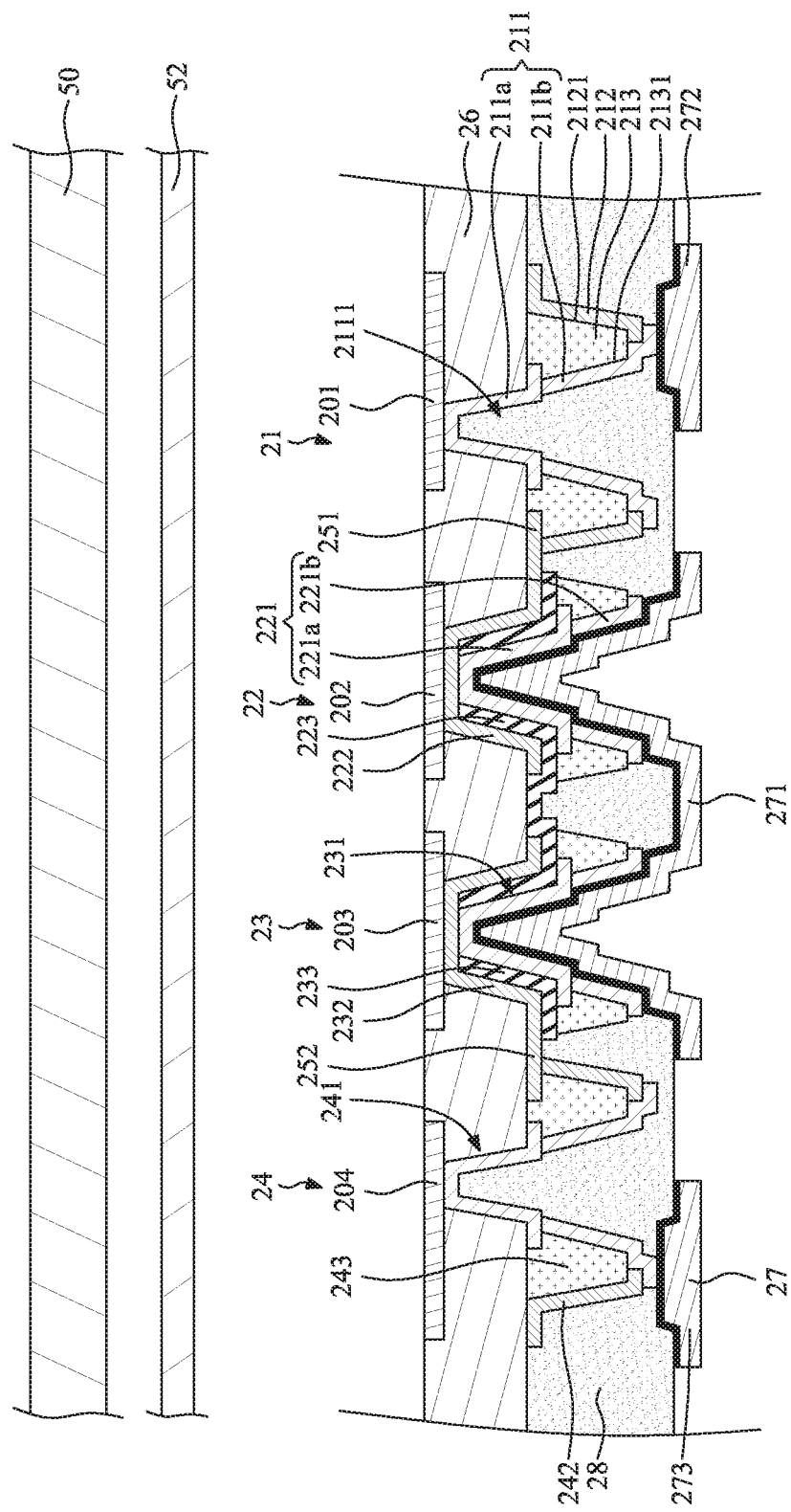
FIG. 43 illustrates one or more stages of an example of a method for manufacturing a heat dissipating device according to some embodiments of the present disclosure.

Referring to FIG. 43, the carrier 50 and the release layer 52 are removed.

Figure 44:
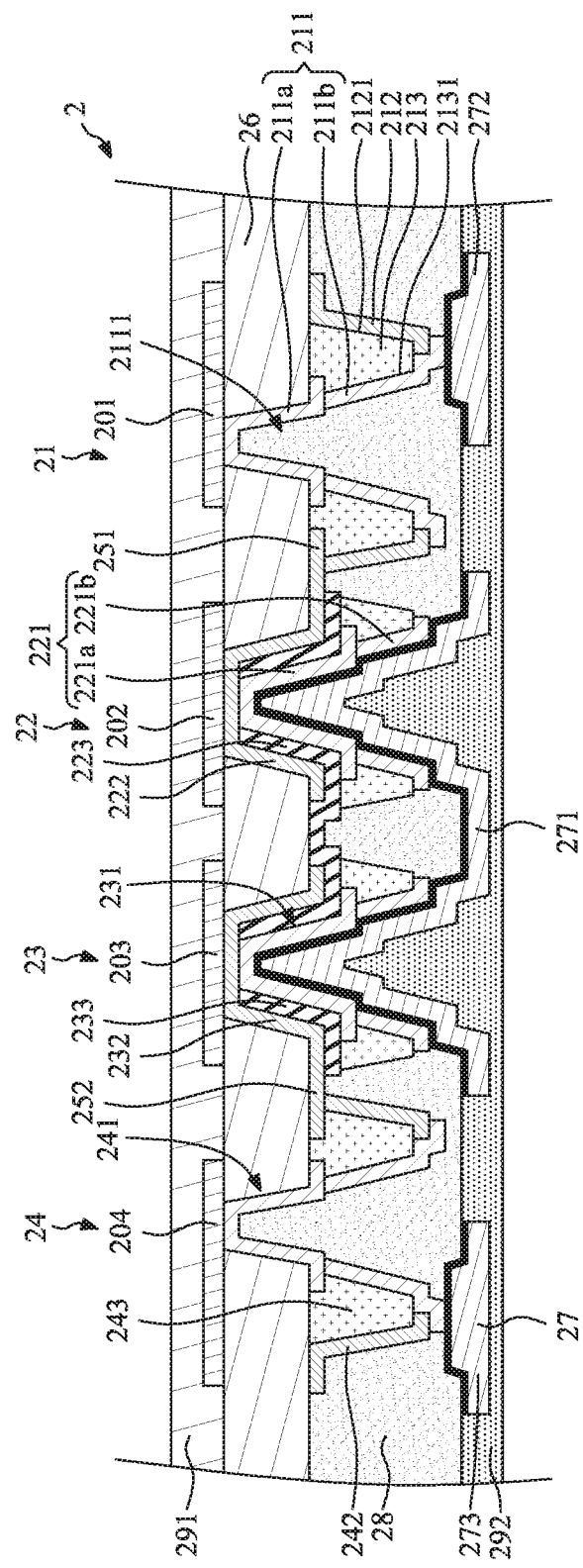
FIG. 44 illustrates one or more stages of an example of a method for manufacturing a heat dissipating device according to some embodiments of the present disclosure.

Referring to FIG. 44, a first protection layer 291 (e.g., a solder resist layer) is formed or disposed to cover the top surface of the first dielectric layer 26 and the dummy pads 201, 202, 203, 204. Meanwhile, a second protection layer 292 (e.g., a solder resist layer) is formed or disposed to cover the bottom surface of the second dielectric layer 28 and the upper patterned circuit layer 27. Meanwhile, a thermal-to-electrical energy conversion apparatus 2 is obtained.

Figure 45:
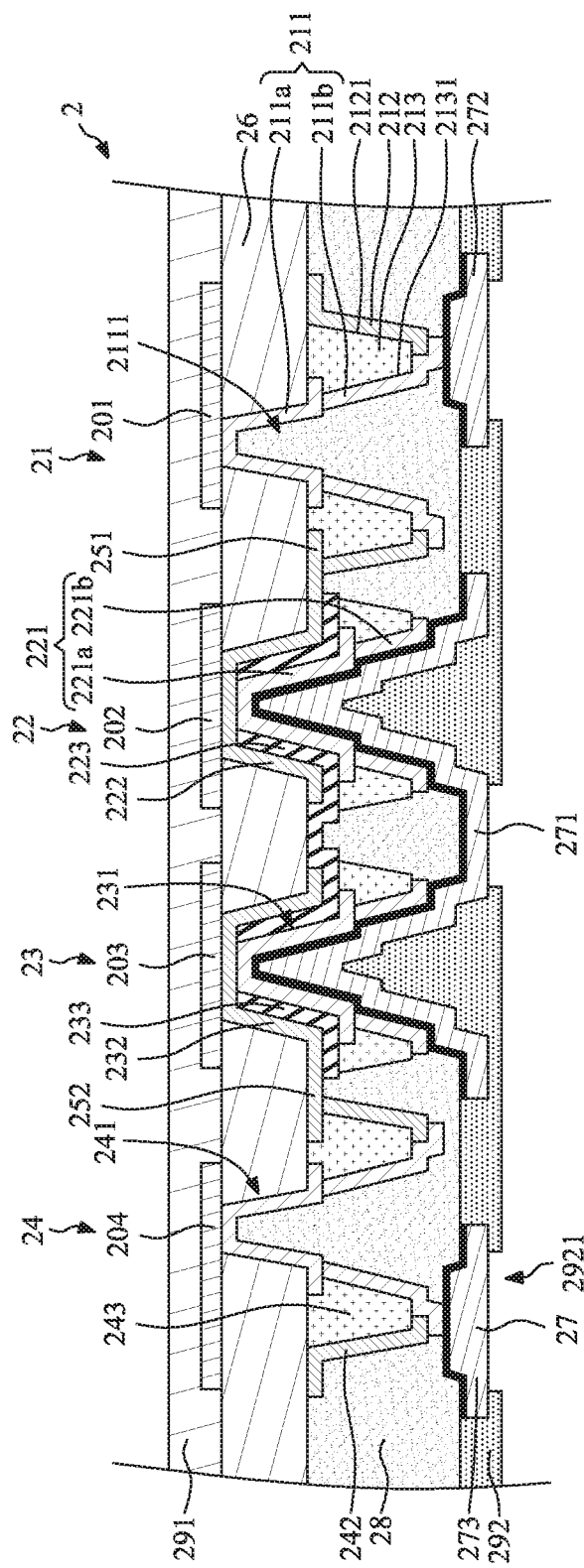
FIG. 45 illustrates one or more stages of an example of a method for manufacturing a heat dissipating device according to some embodiments of the present disclosure.

Referring to FIG. 45, the second protection layer 292 is patterned to define a plurality of openings 2921 to expose the first pad portion 271, the second pad portion 272 and the third pad portion 273.

Figure 46:
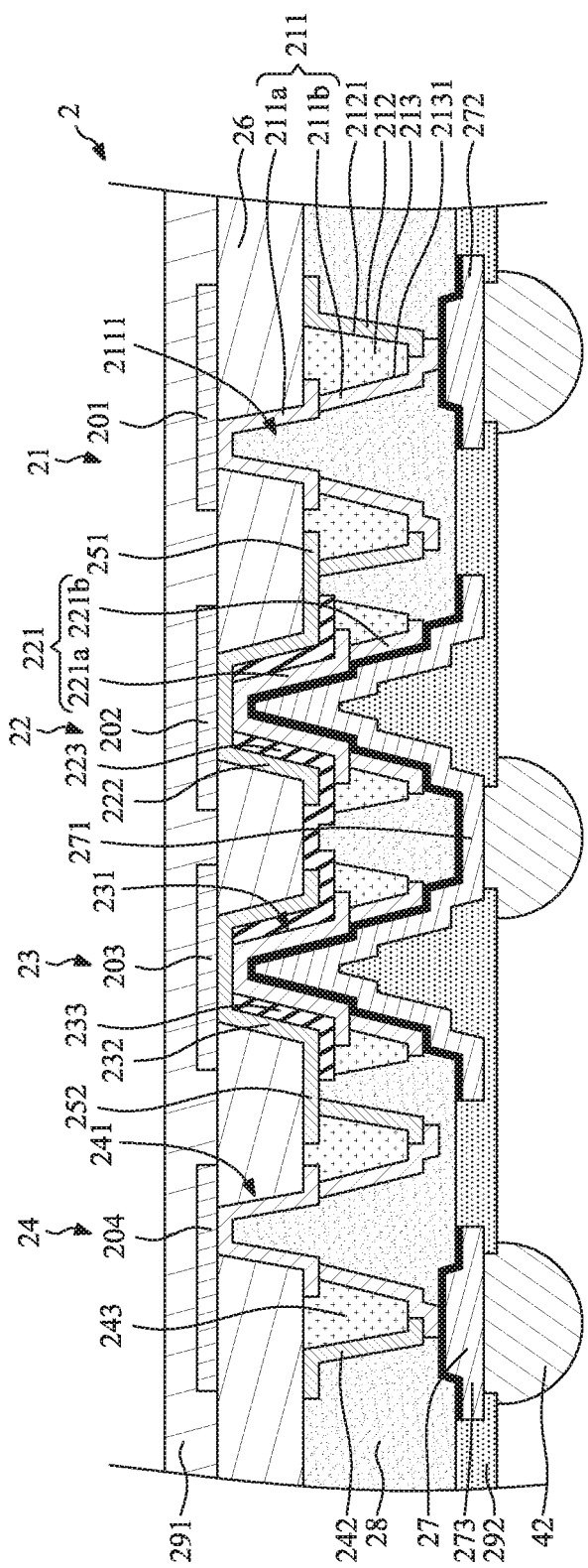
FIG. 46 illustrates one or more stages of an example of a method for manufacturing a heat dissipating device according to some embodiments of the present disclosure.

Referring to FIG. 46, a plurality of interconnection elements 42 (e.g., solder balls) are formed or disposed on the first pad portion 271, the second pad portion 272 and the third pad portion 273 in the openings 2921 of the second protection layer 292 to contact the first pad portion 271, the second pad portion 272 and the third pad portion 273.

Figure 47:
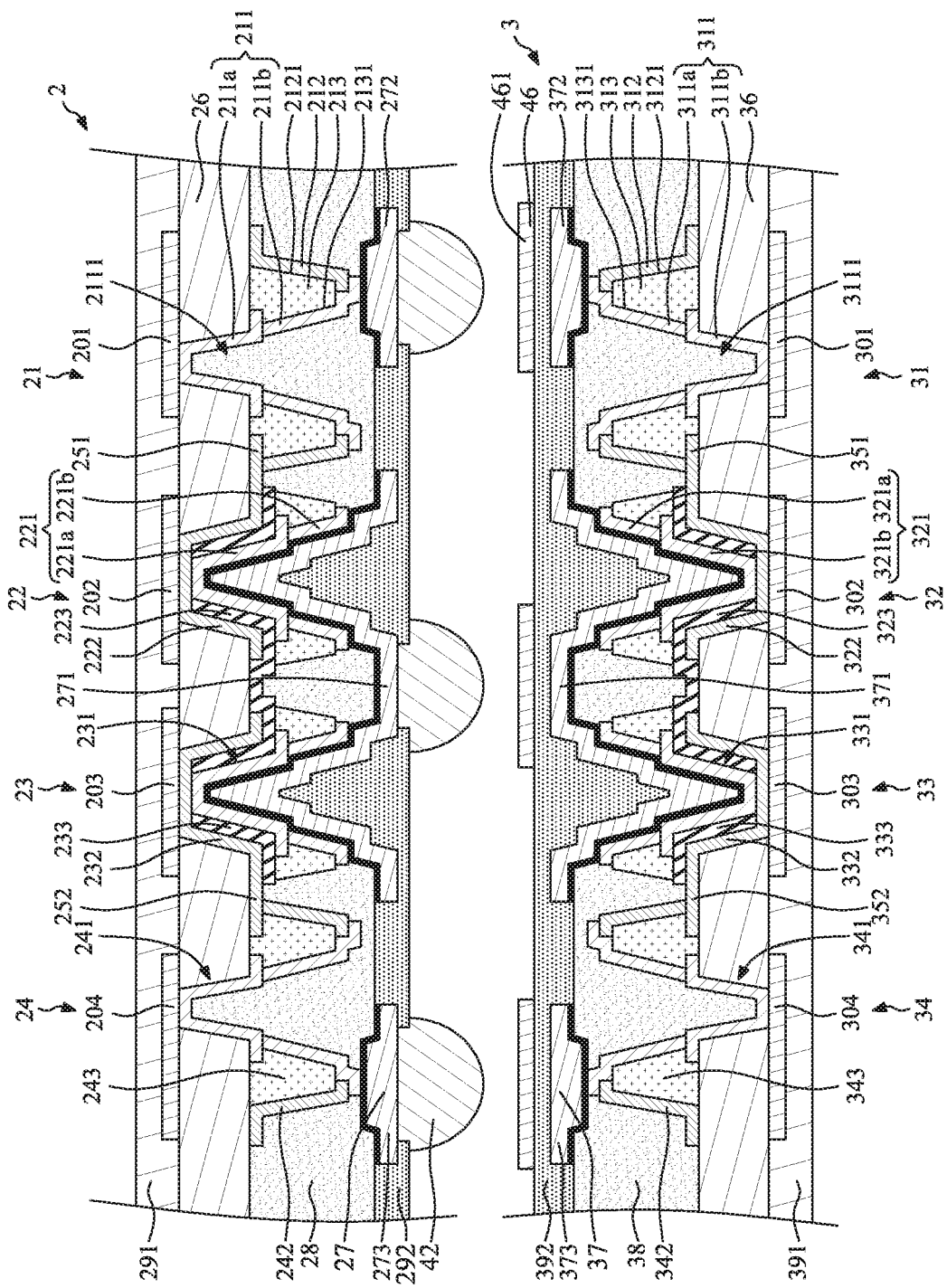
FIG. 47 illustrates one or more stages of an example of a method for manufacturing heat dissipating device according to some embodiments of the present disclosure.

Referring to FIG. 47, an electrical-to-thermal energy conversion apparatus 3 is provided. The structure of the electrical-to-thermal energy conversion apparatus 3 is similar with the structure of the thermal-to-electrical energy conversion apparatus 2. In one embodiment, the structure of the electrical-to-thermal energy conversion apparatus 3 is substantially a mirror reflection of the thermal-to-electrical energy conversion apparatus 2. The electrical-to-thermal energy conversion apparatus 3 is substantially symmetrical to the thermal-to-electrical energy conversion apparatus 2. That is, the electrical-to-thermal energy conversion apparatus 3 may be manufactured as the stages similar to the stages illustrated in FIG. 14 to FIG. 44.

The electrical-to-thermal energy conversion apparatus 3 includes a plurality of lower thermal conduction units (including, for example, a first lower thermal conduction unit 31, a second lower thermal conduction unit 32, a third lower thermal conduction unit 33 and a fourth lower thermal conduction unit 34) electrically connected to one another in series, a first dielectric layer 36, a second dielectric layer 38 on the first dielectric layer 36, a plurality of dummy pads 301, 302, 303, 304, a first protection layer 391, an lower patterned circuit layer 37 and a second protection layer 392. In addition, a middle circuit layer 46 is formed or disposed on the second protection layer 392. The middle circuit layer 46 includes a plurality of pads 461.

Figure 48:
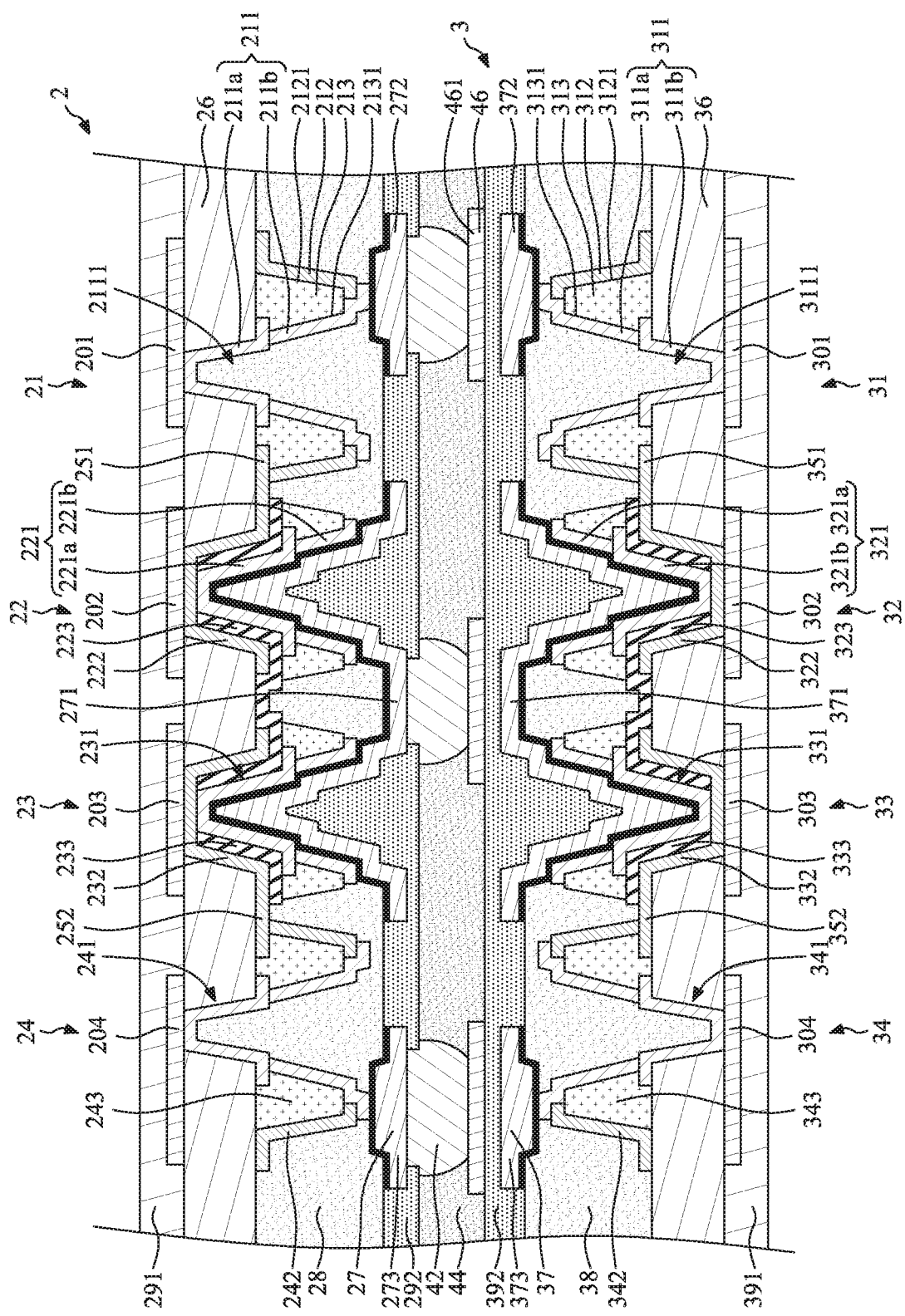
FIG. 48 illustrates one or more stages of an example of a method for manufacturing a heat dissipating device according to some embodiments of the present disclosure.

Referring to FIG. 48, the thermal-to-electrical energy conversion apparatus 2 is attached to the electrical-to-thermal energy conversion apparatus 3 through the interconnection elements 42. As shown in FIG. 48, the interconnection elements 42 are connected to the pads 461. Then, an intermediate layer 44 (e.g., an underfill) is formed or disposed in the space between the electrical-to-thermal energy conversion apparatus 3 and the thermal-to-electrical energy conversion apparatus 2 to cover and protect the interconnection elements 42 and the middle circuit layer 46. Then, a singulation process is conducted so as to obtain the heat dissipating device 4 shown in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. An electronic structure, comprising:
  a substrate having a top surface and a bottom surface opposite to the top surface;
  a first thermal conduction structure embedded in the substrate, and comprising:
    a first conductive via including a first semiconductor material, and comprising an upper portion and a lower portion under the upper portion, wherein a step structure is defined by an inner surface of the upper portion and an inner surface of the lower portion, and;

a first periphery conductor enclosing the first conductive via and including a second semiconductor material, wherein the first periphery conductor is electrically connected to the first conductive via; and a first isolation material interposed between the first conductive via and the first periphery conductor, wherein the upper portion includes a first horizontally extending portion extending into the first isolation material, and the lower portion defines a lower hollow structure exposing the first horizontally extending portion;

an electronic device disposed on the top surface of the substrate, and having an active surface facing the substrate; and a first dielectric layer disposed on the first isolation material and accommodating the upper portion of the first conductive via, wherein the first horizontally extending portion is disposed on a bottom surface of the first dielectric layer.

2. The electronic structure of claim 1, wherein the upper portion defines an upper hollow structure communicated with the lower hollow structure, wherein the electronic structure further comprises a second dielectric layer encapsulating the upper portion and the lower portion, and extending into the upper hollow structure and the lower hollow structure.

3. The electronic structure of claim 1, wherein the first periphery conductor includes a second horizontally extending portion, and an elevation of the second horizontally extending portion is substantially aligned with an elevation of the first horizontally extending portion.

4. The electronic structure of claim 1, wherein the first thermal conduction structure is located within a vertical projection of the active surface of the electronic device, and the electronic structure further comprises a thermal pad disposed between the upper portion of the first conductive via and the electronic device, wherein the thermal pad is electrically insulated from the electronic device.

5. The electronic structure of claim 4, wherein the thermal pad contacts the upper portion of the first conductive via.

6. The electronic structure of claim 5, wherein the thermal pad is configured to transmit the heat therein to the first conductive via.

7. The electronic structure of claim 1, wherein the substrate includes a signal circuit located adjacent to a side of the first thermal conduction structure and electrically connected to the electronic device.

8. The electronic structure of claim 7, further comprising a plurality of external connectors on the bottom surface of the substrate, wherein a first group of the external connectors is disposed within a vertical projection of the first thermal conduction structure, and a second group of the external connectors is disposed outside the vertical projection of the first thermal conduction structure and electrically connected to the electronic device.

9. The electronic structure of claim 8, further comprising an inner via disposed right under the first thermal conduction structure and electrically connected to the first group of the external connectors.

10. The electronic structure of claim 1, wherein the first thermal conduction structure is located within a vertical projection of the active surface of the electronic device, and the electronic structure further comprises a thermal pad disposed between the upper portion of the first conductive via and the electronic device, wherein the thermal pad is electrically insulated from the electronic device; and wherein the substrate includes a signal circuit located adjacent to a side of the first thermal conduction structure and electrically connected to the electronic device.

11. An electronic structure, comprising:
a substrate having a top surface and a bottom surface opposite to the top surface;
a first thermal conduction structure embedded in the substrate, and comprising:
a first conductive via comprising a first upper portion and a first lower portion, wherein the first upper portion is closer to the top surface of the substrate than the first lower portion is, wherein a first step structure is defined by an inner surface of the first upper portion and an inner surface of the first lower portion; and
a second conductive via located at one side of the first conductive via, and comprising a second upper portion and a second lower portion, wherein the second upper portion is closer to the top surface of the substrate than the second lower portion is, wherein a second step structure is defined by an inner surface of the second upper portion and an inner surface of the second lower portion, wherein an elevation of the first step structure is higher than an elevation of the second step structure, wherein the second lower portion defines a lower hollow structure, the second upper portion defines an upper hollow structure communicated with the lower hollow structure;
an electronic device disposed on the top surface of the substrate, and having an active surface facing the substrate;
a first pad disposed on the second conductive via and extending into the upper hollow structure and the lower hollow structure, wherein the first pad has an inner surface and an outer surface opposite to the inner surface, the outer surface of the first pad is closer to the second conductive via than the inner surface of the first pad is, and the inner surface of the first pad is conformal with the second step structure; and
a seed layer between the second conductive via and the first pad, wherein the seed layer has an inner surface and an outer surface opposite to the inner surface, the outer surface of the seed layer is closer to the second conductive via than the inner surface of the seed layer is, and the inner surface of the seed layer is conformal with the second step structure.

12. The electronic structure of claim 11, further comprising a second pad electrically connected to the first conductive via, a voltage of the first pad is greater than a voltage of the second pad.

13. The electronic structure of claim 11, wherein an electrical current flows from the second conductive via to the first conductive via.

14. An electronic structure, comprising:
a substrate having a top surface and a bottom surface opposite to the top surface;
a first thermal conduction structure embedded in the substrate, and comprising:
a first conductive via comprising a first upper portion and a first lower portion, wherein the first upper portion is closer to the top surface of the substrate than the first lower portion is, wherein a first step structure is defined by an inner surface of the first upper portion and an inner surface of the first lower portion; and
a second conductive via located at one side of the first conductive via, and comprising a second upper portion and a second lower portion, wherein the second upper portion is closer to the top surface of the substrate than the second lower portion is, wherein a second step structure is defined by an inner surface of the second upper portion and an inner surface of the second lower portion, wherein an elevation of the first step structure is higher than an elevation of the second step structure;

an electronic device disposed on the top surface of the substrate, and having an active surface facing the substrate; and a second thermal conduction structure disposed right under the first thermal conduction structure and electrically connected to the first thermal conduction structure, wherein a structure of the second thermal conduction structure is substantially same as a structure of the first thermal conduction structure.

* * * * *